(12) United States Patent
Kawashima

(10) Patent No.: US 11,005,420 B2
(45) Date of Patent: May 11, 2021

(54) QUARTZ CRYSTAL UNIT, QUARTZ CRYSTAL OSCILLATOR AND ELECTRONIC APPARATUS

(71) Applicant: PIEDEK TECHNICAL LABORATORY, Tokyo (JP)

(72) Inventor: Hirofumi Kawashima, Tokyo (JP)

(73) Assignee: PIEDEK TECHNICAL LABORATORY, Tokyo (JP)

( * ) Notice: Subject to any disclaimer, the term of this patent is extended or adjusted under 35 U.S.C. 154(b) by 323 days.

(21) Appl. No.: 16/041,227

(22) Filed: Jul. 20, 2018

(65) Prior Publication Data

US 2019/0068163 A1 Feb. 28, 2019

(30) Foreign Application Priority Data

Jul. 24, 2017 (JP) .............................. JP2017-154704

(51) Int. Cl.
*H03H 9/215* (2006.01)
*H03B 5/32* (2006.01)
(Continued)

(52) U.S. Cl.
CPC ............. *H03B 5/32* (2013.01); *H01L 41/053* (2013.01); *H01L 41/094* (2013.01); *H01L 41/18* (2013.01);
(Continued)

(58) Field of Classification Search
CPC .. H03H 9/15; H03H 9/05; H03H 9/19; H03H 9/21; H03H 9/215; H03B 5/36
See application file for complete search history.

(56) References Cited

U.S. PATENT DOCUMENTS 9,257,959 B2 * 2/2016 Yamada ............... H03H 9/0547
2010/0156237 A1 * 6/2010 Ichikawa ................. H03H 9/19
310/312

(Continued)

FOREIGN PATENT DOCUMENTS

JP 2008-219396 A 9/2008
JP 2014-200051 A 10/2014
JP 2015-149591 A 8/2015

OTHER PUBLICATIONS

Japan Patent Office, "Office Action for Japanese Patent Application No. 2017-154704," dated Feb. 20, 2018.

(Continued)

*Primary Examiner* — J. San Martin
(74) *Attorney, Agent, or Firm* — Manabu Kanesaka

(57) ABSTRACT

In a quartz crystal unit, the unit comprising a case, and a resonator having a base portion, and first and second vibrational arms, the base portion having a first base portion including a first width, and a second base portion including a second width greater than the first width, each of the first and second vibrational arms having a first vibrational portion including a first width and a first length, and a second vibrational portion including a second width greater the first width and a second length less than the first length, the second base portion being mounted on a mounting portion of the case, at least one groove being formed in at least one of opposite main surfaces of the first vibrational portion of each vibrational arm, and a spaced-apart distance between the second vibrational portions of the first and second vibrational arms being less than a length of the second base portion of the base portion.

26 Claims, 12 Drawing Sheets

(51) Int. Cl.
    *H01L 41/18*     (2006.01)
    *H03H 9/19*     (2006.01)
    *H03H 9/02*     (2006.01)
    *H03H 9/10*     (2006.01)
    *H03H 9/05*     (2006.01)
    *H01L 41/053*     (2006.01)
    *H01L 41/09*     (2006.01)
    *H03B 5/36*     (2006.01)

(52) U.S. Cl.
    CPC ........... *H03B 5/36* (2013.01); *H03H 9/02157* (2013.01); *H03H 9/05* (2013.01); *H03H 9/0509* (2013.01); *H03H 9/1021* (2013.01); *H03H 9/19* (2013.01); *H03H 9/215* (2013.01)

(56) References Cited

U.S. PATENT DOCUMENTS

2010/0301958 A1* 12/2010 Kawashima ....... G01C 19/5607
    331/163
2015/0188516 A1* 7/2015 Yamada ................ H03H 9/19
    331/156

OTHER PUBLICATIONS

Japan Patent Office, "Office Action for Japanese Patent Application No. 2017-154704," dated Nov. 14, 2017.

\* cited by examiner

QUARTZ CRYSTAL UNIT, QUARTZ CRYSTAL OSCILLATOR AND ELECTRONIC APPARATUS

RELATED APPLICATIONS

The present application is based on, and claims priority from, Japanese Application No. JP2017-154704 filed Jul. 24, 2017, the disclosure of which is hereby incorporated by reference herein in its entirety.

BACKGROUND OF THE INVENTION

1. Field of the Invention

The present invention relates to a resonator made of a piezoelectric material such as quartz crystal, a unit, an oscillator and an electronic apparatus.

2. Background Information

There are many electronic apparatuses comprising a display portion and a quartz crystal oscillator. For example, iPhones, wristwatches, facsimiles and digital cameras comprising a quartz crystal oscillator are well known. Recently, because of high stability for frequency, miniaturization and the light weight nature of these electronic apparatuses, the need for an electronic apparatus comprising a much smaller quartz crystal oscillator with a frequency of high stability has arisen. For example, the quartz crystal oscillator having a quartz crystal tuning fork resonator is widely used as a time standard in an electronic apparatus such as the iPhones, the wristwatches, the facsimiles and the digital cameras.

Heretofore, however, it has been impossible to obtain an electronic apparatus comprising a smaller quartz crystal oscillator with a miniature quartz crystal tuning fork resonator of the prior art having a frequency of high stability, a small series resistance and a high quality factor. This is the reason why, when miniaturized, the quartz crystal tuning fork resonator of the prior art has a much smaller electromechanical transformation efficiency. As a result of which, the resonator has a frequency of low stability, a large series resistance and a reduced quality factor.

It is, therefore, a general object of the present invention to provide embodiments of a quartz crystal resonator, a quartz crystal unit, a quartz crystal oscillator and an electronic apparatus, which overcome or at least mitigate one or more of the above problems.

SUMMARY OF THE INVENTION

The present invention relates to a resonator, a unit, an oscillator and an electronic apparatus comprising a display portion and an oscillator, and in particular, relates to a quartz crystal resonator capable of vibrating in a flexural mode, a quartz crystal unit having the quartz crystal resonator, a quartz crystal oscillator having the quartz crystal unit and an electronic apparatus having the quartz crystal oscillator.

It is an object of the present invention to provide a miniature tuning fork resonator, and in particular, a miniature quartz crystal tuning fork resonator having a small series resistance $R1$, a small motional inductance $Lm$ and a small capacitance ratio $r$.

It is an another object of the present invention to provide a miniature unit with a length of the maximum side less than or equal to 1.35 mm, and a tuning fork resonator which is strong against shock, and in particular, a miniature quartz crystal unit with a quartz crystal tuning fork resonator having a small series resistance $R1$, a small motional inductance $Lm$ and a small capacitance ratio $r$.

It is a further object of the present invention to provide an oscillator having a unit with a tuning fork resonator, and in particular, a quartz crystal oscillator having a quartz crystal unit with a miniature quartz crystal tuning fork resonator having a frequency of high stability, a small series resistance $R1$ and a high quality factor $Q1$.

It is a still another object of the present invention to provide an electronic apparatus comprising a display portion and an oscillator.

According to a first aspect of the present invention, there is provided a quartz crystal unit comprising a case, a lid, and a resonator having a base portion, and first and second vibrational arms connected to the base portion, the base portion having a first base portion including a first width, and a second base portion including a second width greater than the first width, each of the first and second vibrational arms having a first vibrational portion including a first width and a first length, and a second vibrational portion including a second width greater the first width and a second length less than the first length, the first vibrational portion having a first main surface and a second main surface opposite the first main surface, in which the second base portion of the base portion is mounted on a mounting portion of the case, and at least one groove is formed in at least one of the first and second main surfaces of the first vibrational portion of each of the first and second vibrational arms, and in which a spaced-apart distance between the second vibrational portion of the first vibrational arm and the second vibrational portion of the second vibrational arm is less than a length of the second base portion of the base portion.

In addition, the base portion has a length $L2$, and the second length is defined by $Le$, in which the second length $Le$ is greater than or equal to the length $L2$ of the base portion.

In order to get the quartz crystal unit having the resonator miniaturized, e.g. a tuning fork resonator miniaturized with a small series resistance $R1$, a small motional inductance $Lm$, a high quality factor $Q1$, a small capacitance ratio $r1$, high shock-proof properties, no vibration leakage which is caused by vibration, and a high stability of frequency, a first length dimension $Lo=a+b+c+d$ is within a range of 2.4 mm to 5 mm, and a second length dimension $Li=A+B+C+D$ is within a range of 1.6 mm to 4.2 mm, where a, b, c, and d, respectively, represent a length of an outer side surface of each of the first, second, third and fourth case (or frame) portions of a case (or frame), and A, B, C, and D, respectively, represent a length of an inner side surface of each of the first, second, third and fourth case (or frame) portions of the case (or the frame).

In addition, there is also provided the resonator or the tuning fork resonator miniaturized with the various characteristics described above by providing a dimension difference $Loi$ within a range of 0.8 mm to 3.4 mm, where $Loi$ represents $Loi=Lo-Li$.

Moreover, when a spaced-apart distance between the second vibrational portion of the second (or first) vibrational arm and the second (first) case (or frame) portion is defined by $W4$, the fourth case (or frame) portion adjoins the second vibrational portion of each of the first and second vibrational arms, and a spaced-apart distance between the fourth case (or frame) portion and the second vibrational portion of the second (or first) vibrational arm is defined by $L3$, the resonator or the tuning fork resonator has a relationship of $W4>L3$.

Furthermore, the at least one groove has a groove including a width W12, and a ratio We/W12 of the second width W12 and the width W12 is within a range of 1.875 to 15, and when a distance in the width direction of the groove measured from an outer edge of the groove to an outer edge of the corresponding one of the first and second vibrational arms is defined by W13, a ratio W13/W12 is greater than or equal to 0.045 and less than or equal to 0.8. In addition, when the at least one groove has a first groove and a second groove each including a width W12, a ratio We/W12 of the second width We and the width W12 is within a range of 5.3 to 13.9. In addition to this, when a distance in the width direction of the first and second grooves measured from an outer edge of the first groove to an outer edge of the second groove is defined by W11, a ratio We/W11 is greater than or equal to 40 and less than or equal to 100, and also when a distance in the width direction of the first groove measured from an outer edge of the first groove to an outer edge of the corresponding one of the first and second vibrational arms is defined by W13, a ratio W13/W11 is greater than or equal to 0.2 and less than or equal to 3.0.

In addition, when a spaced-apart distance between the second vibrational portions is defined by W3 and a spaced-apart distance between the first vibrational portion of the first vibrational arm and the first case (or frame) portion is defined by W5, the resonator or the tuning fork resonator has a relationship of W3<W5, and e.g. W3 is within a range of 0.015 mm to 0.1 mm.

In addition to this, when a spaced-apart distance between the first vibrational portions is defined by W7 and a spaced-apart distance between the fourth case (or frame) portion and the second vibrational portion is defined by L3, a ratio WL73=W7/L3 is within a range of 1.2 to 5.5.

According to a second aspect of the present invention, there is provided a quartz crystal oscillator with the quartz crystal unit having a case (or frame), a lid and the resonator or the tuning fork resonator described above.

In addition, when a spaced-apart distance between the first case (or frame) portion and the base portion is defined by W8 and a spaced-apart distance between the second case (or frame) portion and the base portion is defined by W9, there is provided the oscillator having a relationship of the distances W8, W9 greater than the distance W3, where W3 represents the spaced-apart distance between the second vibrational portions.

In order to get the quartz crystal oscillator with a high stability of frequency and the quartz crystal unit having a length less than 1.35 mm and a decreased mounting area, e.g. when the resonator comprises a tuning fork resonator, and an overall length of the tuning fork resonator is defined by Lov, a maximum width of the tuning fork resonator is defined by Wov and a ratio of Wov and Lov is defined by WLov=Wov/Lov, there is provided the quartz crystal oscillator with the quartz crystal unit having the ratio WLov within a range of 0.25 to 0.69.

According to a third aspect of the present invention, there is provided an electronic apparatus comprising a display portion and the quartz crystal oscillator described above. Namely, an output signal of the quartz crystal oscillator is a clock signal for use in operation of the electronic apparatus at the display portion thereof.

Preferably, the ratio We/W12 of the second width We and the width W12 of the groove is within a range of 2.5 to 4.1.

Preferably, the ratio W13/W12 of the distance W13 and the width W12 of the groove is within a range of 0.046 to 0.075.

Preferably, the distance W3 is within a range of 0.02 mm to 0.07 mm, more preferably, within a range of 0.035 mm to 0.065 mm.

Preferably, the ratio WL73 of the distance W7 and the length L3 is within a range of 1.5 to 4.8.

Preferably, the distance L3 is within a range of 0.025 mm to 0.1 mm.

The present invention will be more fully understood by referring to the following detailed specification and claims taken in connection with the appended drawings.

DETAILED DESCRIPTION OF THE PREFERRED EMBODIMENTS

Figure 1:
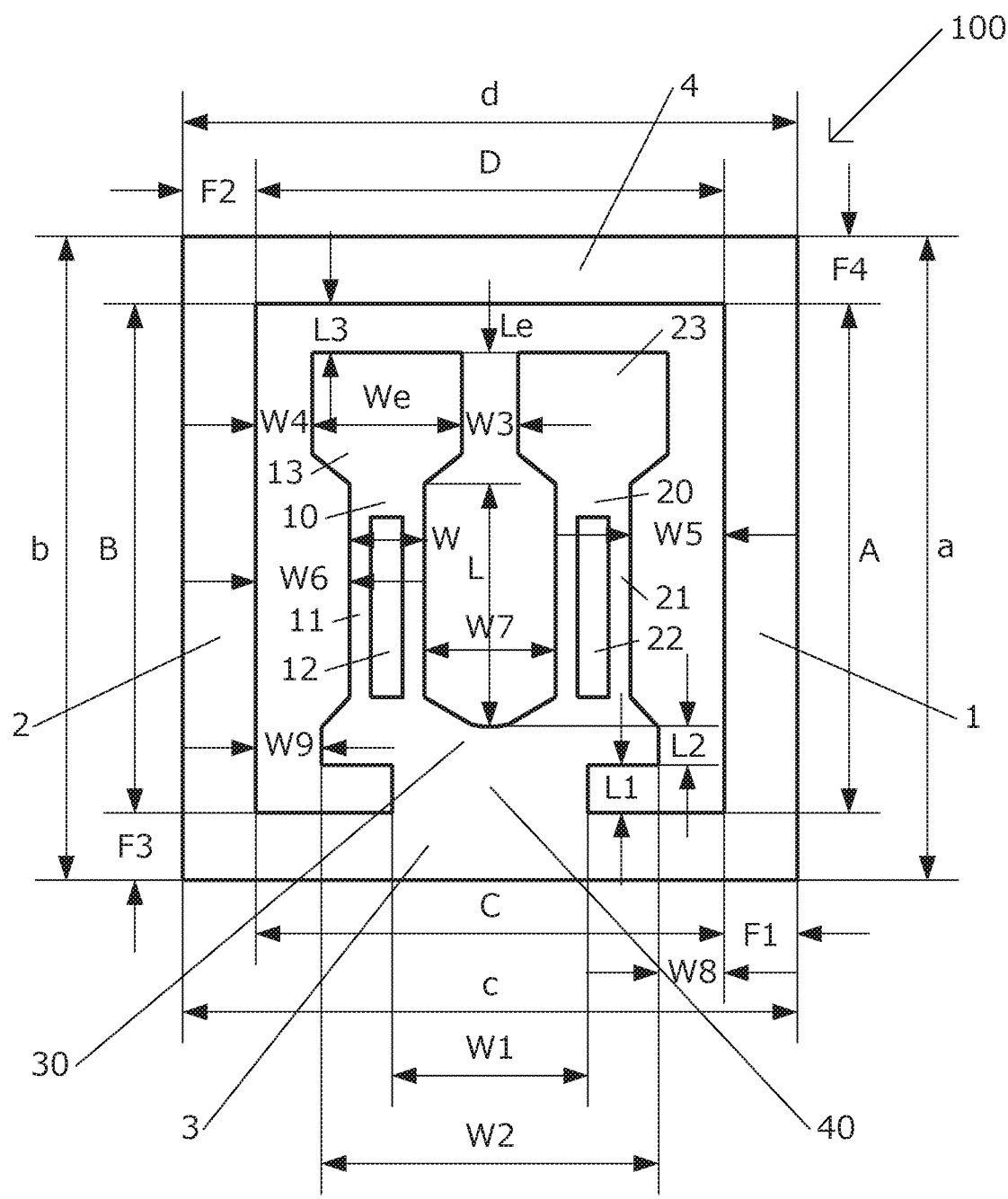
FIG. 1 shows a plan view of a tuning fork resonator in a first embodiment of the present invention.

Referring now to the drawings, the embodiments of the present invention will be described in more detail.

FIG. 1 shows a plan view of a tuning fork resonator 100 in a first embodiment of the present invention, for example, the tuning fork resonator 100 is a piezoelectric tuning fork resonator made of a piezoelectric material or a quartz crystal tuning fork resonator made of quartz crystal. The resonator 100 comprises a base portion 30, tuning fork arms 10, 20 (vibrational arms 10, 20) connected to the base portion 30, a connecting portion 40 connected to the base portion 30 and a frame which has a first frame portion 1, a second frame portion 2, a third frame portion 3 and a fourth frame portion 4.

In addition, the third frame portion 3 is connected to the connecting portion 40, and the first frame portion 1 is connected to the second frame portion 2 through the third frame portion 3 and the fourth frame portion 4. Also, the base portion 30 is connected to the third frame portion 3 through the connecting portion 40. However, this invention is riot limited to this, but may have the base portion 30 directly connected to the third frame portion 3.

In FIG. 1, an electrode which is disposed on each of the tuning fork arms 10, 20, the base portion 30 and the frame is not shown. But, it is needless to say that the electrode is disposed so that the resonator vibrates in a flexural mode of an inverse phase and two electrode terminals of the resonator are connected to a printed board.

In addition, the tuning fork arm 10 comprises a first vibrational portion 11 having a first width W and a first length L and a second vibrational portion 13 having a second width We greater than the first width W and a second length Le less than the first length L, and a groove 12 is formed in an obverse surface (first main surface) of the first vibrational portion 11 and a groove 32 (not visible) is formed in a reverse surface (second main surface) of the first vibrational portion 11.

Similar to this, the tuning fork arm 20 comprises a first vibrational portion 21 having a first width W and a first length L and a second vibrational portion 23 having a second width We greater than the first width W and a second length Le less than the first length L, and a groove 22 is formed in an obverse surface (first main surface) of the first vibrational portion 21 and a groove 42 (not visible) is formed in a reverse surface (second main surface) of the first vibrational portion 21.

In addition to this, a width of each of the grooves 12, 22, 32 and 42 is greater than or equal to 0.02 mm and less than or equal to 0.04 mm, preferably, within a range of 0.021 mm to 0.04 mm, more preferably within a range of 0.025 mm to 0.039 mm or within a range of 0.027 mm to 0.035 mm. When a distance in the width direction of the groove 12 measured from a first outer edge of the groove 12 to a first outer edge of the tuning fork arm 10 is defined by a first distance and a distance in the width direction of the groove 12 measured from a second outer edge opposite the first outer edge of the groove 12 to a second outer edge opposite the first outer edge of the tuning fork arm 10 is defined by a second distance.

Similar to this, when a distance in the width direction of the groove 22 measured from a first outer edge of the groove 22 to a first outer edge of the tuning fork arm 20 is defined by a third distance and a distance in the width direction of the groove 22 measured from a second outer edge opposite the first outer edge of the groove 22 to a second outer edge opposite the first outer edge of the tuning fork arm 20 is defined by a fourth distance, each of the first, second, third and fourth distances is greater than or equal to 0.001 mm and less than or equal to 0.003 mm, preferably, within a range of 0.001 mm to 0.0025 mm.

In addition, a length of each of the grooves 12, 22, 32 and 42 is greater than or equal to 0.3 mm and less than or equal to 0.55 mm, preferably, within a range of 0.3 mm to 0.45 mm or within a range of 0.31 mm to 0.54 mm, more preferably, within a range of 0.31 mm to 0.52 mm.

In detail, the first width W of the first vibrational portion is greater than or equal to 0.025 mm and less than or equal to 0.043 or greater than or equal to 0.03 mm and less than or equal to 0.05 mm, preferably, within a range of 0.026 mm to 0.039 mm or within a range of 0.028 mm to 0.042 mm, more preferably, within a range of 0.03 mm to 0.047 mm or within a range of 0.035 mm to 0.048 mm, and also, the first length L of the first vibrational portion is within a range of 0.3 mm to 0.75 mm, preferably, within a range of 0.32 mm to 0.72 mm or within a range of 0.32 mm to 0.56 mm, more preferably, within a range of 0.3 mm to 0.55 mm or within a range of 0.34 mm to 0.53 mm.

In more detail, a ratio of the length of each of the grooves 12, 22, 32 and 42 and the first length L of the first vibrational portion is greater than or equal to 0.81 and less than or equal to 0.96, preferably, 0.846 to 0.95, more preferably, within a range of 0.846 to 0.92 or within a range of 0.85 to 0.955, as a result of which a resonator can be obtained with a small series resistance R1 and a small motional inductance Lm, even when the resonator is miniaturized extremely because the resonator has a high electrical-mechanical transformation efficiency.

In addition, there is a relationship of We<Le or We=Le between the second width We of the second vibrational portion and the second length Le of the second vibrational portion. The second width We is greater than 0.075 mm and less than 0.105 mm or greater than 0.1 mm and less than 0.3 mm, preferably, within a range of 0.076 mm to 0.102 mm or within a range of 0.12 mm to 0.26 mm, and the second length Le is greater than 0.15 mm and less than 0.5 mm, preferably, within a range of 0.17 mm to 0.38 mm, more preferably, within a range of 0.17 mm to 0.3 mm. Namely, a ratio We/W is greater than 1.5 and less than 12, preferably, within a range of 1.75 to 5.7 or within a range of 2.35 to 5.8, more preferably, within a range of 1.75 to 2.1 or within a range of 2.3 to 2.8 or within a range of 3.7 to 5.7, still more preferably, within a range of 2.35 to 2.9 or within a range of 5.6 to 9.5.

Moreover, when a spaced-apart distance between the first frame portion 1 and the first vibrational portion 21 of the tuning fork arm 20 is defined by W5 and a spaced-apart distance between the second frame portion 2 and the first vibrational portion 11 of the tuning fork arm 10 is defined by W6, there is a relationship of We>W5, W6.

Especially, to get a resonator with a decreased acoustic effect which is caused by vibration, each of W5, W6 is within a range of 0.02 mm to 0.18 mm, preferably, within a range of 0.03 mm to 0.16 mm.

Furthermore, when a spaced-apart distance between the second vibrational portion 13 of the tuning fork arm 10 and the second vibrational portion 23 of the tuning fork arm 20 is defined by W3, there is a relationship of W3<W5, W6, and e.g. W3 is within a range of 0.015 mm to 0.1 mm, preferably, within a range of 0.02 mm to 0.07 mm or within a range of 0.038 mm to 0.057 mm, more preferably, within a range of 0.035 mm to 0.065 mm or within a range of 0.04 mm to 0.058 mm.

In addition, a spaced-apart distance between the first vibrational portion 11 of the tuning fork arm 10 and the first vibrational portion 21 of the tuning fork arm 20 is defined by W7, there is a relationship of We=W7 or We≠W7, where We represents the second width of the second vibrational portion.

In other words, there is a relationship of We>W7 or We<W7, particularly, when a resonator is needed with good aging characteristics, the resonator has the relationship of We>W7, while when a resonator is needed with no vibration leakage which is caused by vibration, the resonator has the relationship of We<W7. In addition to this, there is a relationship of W7>W5, W6 to get a resonator with a high-stable frequency of oscillation and good shock-proof properties.

However, this invention is not limited to this, but may include a relationship of W7≤W5, W6 when a resonator is particularly needed with an overall wider width and a decreased acoustic effect which is caused by vibration. In addition to this, as already described above, as there is the relationship of We<W7 when the resonator is needed with no vibration leakage which is caused by vibration, a relationship of We<W5, W6 is obtained from the relation of We<W7 and W7<W5, W6 to get the resonator with no vibration leakage and the decreased acoustic effect.

Moreover, the base portion 30 has a width W2 and a length L2, and the connecting portion 40 has a width W1 and a length L1, as shown in FIG. 1, there is a relationship of W2>W1.

Additionally, the first frame portion 1 has a dimension (length) a of an outer side surface, a dimension (length) A of an inner side surface and a width F1, the second frame portion 2 has a dimension (length) b of an outer side surface, a dimension (length) B of an inner side surface and a width F2, the third frame portion 3 has a dimension (length) c of an outer side surface, a dimension (length) C of an inner side surface and a width F3 and the fourth frame portion 4 has a dimension (length) d of an outer side surface, a dimension (length) D of an inner side surface and a width F4.

In addition, a spaced-apart distance between the second vibrational portion 13 of the tuning fork arm 10 and the second frame portion 2 is defined by W4, and also a spaced-apart distance between the second vibrational portion 23 of the tuning fork arm 20 and the first frame portion 1 is defined by W4.

Moreover, a spaced-apart distance between the fourth frame portion 4 and the second vibrational portion 13 of the tuning fork arm 10 is defined by L3, and also a spaced-apart distance between the fourth frame portion 4 and the second vibrational portion 23 of the tuning fork arm 20 is defined by L3. Namely, the distance L3 is a spaced-apart distance between an end portion of the tuning fork arm 10 and the fourth frame portion 4 and also, a spaced-apart distance between an end portion of the tuning fork arm 20 and the fourth frame portion 4.

Furthermore, a spaced-apart distance between the base portion 30 and the first frame portion 1 is defined by W8 and a spaced-apart distance between the base portion 30 and the second frame portion 2 is defined by W9.

In more detail, W4 and W3 have a relationship of W4=W3 or W4≠W3, particularly, when a resonator is needed with a decreased acoustic effect which is caused by vibration, the resonator has the relationship of W4≥W3.

To get the resonator with a decreased acoustic effect, W4 is greater than 0.01 mm and less than 0.2 mm, preferably, within a range of 0.012 mm to 0.18 mm, more preferably, 0.025 mm to 0.1 mm.

In addition, L3 and W4 have a relationship of L3=W4 or L3≠W4, particularly, when a resonator is needed with high shock-proof properties, the resonator has the relationship of L3≤W4.

To get the resonator with high shock-proof properties, L3 is greater than 0.01 mm and less than 0.2 mm, preferably, within a range of 0.015 mm to 0.18 mm, more preferably, 0.025 mm to 0.1 mm.

In order to manufacture easily the tuning fork resonator 10 in an etching process including chemical, physical and mechanical methods, there is a relationship of W3, W4=W8, W9 or W3, W4≠W8, W9, in particular, when a resonator is needed with good shock-proof properties, the resonator has a relationship of W3, W4≤W8, W9.

In addition, the length L2 of the base portion 30 is equal to or greater than the distance L3, namely, L2≥L3. Moreover, the length L1 of the connecting portion 40 is equal to L3 or different from that of L3. In other words, L1=L3 or L1≠L3, in particular, to get a resonator with high shock-proof properties, there is a relationship of L1<L3.

However, this invention is not limited to the contents described above, but may have the following contents. In detail, concerning W3 and W4, particularly, when a resonator is needed with good shock-proof properties, the resonator may have a relationship of W4<W3. In addition, regarding L3 and W4, particularly, when a resonator is needed with a decreased acoustic effect which is caused by vibration, the resonator may have a relationship of L3>W4.

In addition to this, with respect to W3, W4 and W8, W9, particularly, when a resonator is needed with no vibration leakage which is caused by vibration, the resonator may have a relationship of W3, W4>W8, W9. Moreover, concerning L2 and L3, there may be a relationship of L2<L3 when a resonator is highly needed with no acoustic effect which is caused by vibration and with an easy formation in a chemical etching process. Furthermore, regarding L1 and L3, particularly, when a resonator is highly needed with no vibration leakage which is caused by vibration, there may be a relationship of L1>L3.

As the first width of the first vibrational portion of each of the tuning fork arms 10, 20 is defined by W and the first length of the first vibrational portion of each of the tuning fork arms 10, 20 is defined by L, a ratio W/L is greater than 0.098, preferably, within a range of 0.0981 to 0.11 or the ratio W/L is less than 0.097, preferably, within a range of 0.0675 to 0.072 or within a range of 0.088 to 0.0968. In addition, when a ratio of the spaced-apart distance W7 between the first vibrational portions 11, 21 and the spaced-apart distance L3 between the fourth frame portion 4 and the second vibrational portion is defined by W7/L3=WL73, the ratio WL73 is within a range of 1.2 to 5.5, preferably, within a range of 1.5 to 4.8 or within a range of 1.85 to 4.97, more preferably, 2.1 to 3.8. As a result of which there is an outstanding effect that the resonator is obtained with no energy losses which are caused by vibration.

In order to obtain the resonator 100 with a small series resistance R1, a small capacitance ratio r, a small motional inductance Lm and a high quality factor Q, and also with no energy losses which are caused by vibration, as the second length of the second vibrational portion of each of the tuning fork arms 10, 20 is defined by Le, the length of the base portion is defined by L2 and the width of the third frame portion 3 is defined by F3, there is a relationship of Le≥L2, F3. In addition, there is a relationship of W1<W2, C, where W1, W2 and C represent the width of the connecting portion 40, the width of the base portion 30 and the length of the inner side surface of the third frame portion 3, respectively. For example, W1 is greater than 0.04 mm and less than 0.2 mm, preferably, within a range of 0.045 mm to 0.18 mm, more preferably, within a range of 0.045 mm to 0.093 mm.

Furthermore, to get a unit with the resonator which has a length dimension shorter than the prior art and is proof against strong shock, there is a relationship of L2>L1, F3, and the length L2 is within a range of 0.025 mm to 0.12 mm, preferably, 0.025 mm to 0.08 mm, more preferably, 0.025 mm to 0.078 mm, while the length L1 is greater than 0.01 mm and less than 0.12 mm, preferably, 0.015 mm to 0.08 mm, more preferably, within a range of 0.015 mm to 0.04 mm. However, this invention is not limited to this, but may include L2 and F3 having a relationship of L2<F3, especially, to get a unit having a resonator with no vibration leakage which is caused by vibration.

In addition, the first, second, third and fourth frame portions F1, F2, F3 and F4 generally have a relationship of F1=F2=F3=F4. But, to get a unit with a short length dimension and high shock-proof properties, F1, F2>F3, F4, in detail, F1 and/or F2 is within a range of 0.1 mm to 0.32 mm, preferably, 0.15 mm to 0.29 mm, more preferably, within a range of 0.18 mm to 0.29 mm. However, this invention is not limited to this, but may have a dimension of the four frame portions F1, F2, F3 and F4 so that a width of each of the four frame portions is different or a width of at least one of the four frame portions is different.

For first example, when F4 has a dimension different from that of each of F1, F2, and F3, there is a relationship of F4≠F1, F2, F3. In this case, all of F1, F2 and F3 has the same value or all of F1, F2 and F3 has a value different each other or two of F1, F2 and F3 has the same value and one of F1, F2 and F3 is different from the other of F1, F2 and F3, e.g. F1=F2>F3 or F1=F2<F3.

For second example, when F3 has a dimension different from that of each of F1, F2 and F4, there is a relationship of F3≠F1, F2, F4. In this case, all of F1, F2 and F4 has the same value or all of F1, F2 and F4 has a value different each other or two of F1, F2 and F4 has the same value and one of F1, F2 and F4 is different from the other of F1, F2 and F4, e.g. F1=F2>F4 or F1=F2<F4.

For third example, when F3 is equal to or different from F4, particularly, when a resonator is needed with a short length dimension and no vibration leakage which is caused by vibration, the resonator has a relationship of F3≧F4.

In more detail, F4 is within a range of 0.001 mm to 0.12 mm, preferably, within a range of 0.01 mm to 0.12 mm or within a range of 0.001 mm to 0.05 mm, more preferably, greater than 0.01 mm and less than 0.05 mm, as a result of which an outstanding effect is obtained that a unit has a very stable frequency of oscillation, a length dimension shorter than that of the prior art and a mounting area less than that of the prior art.

For fourth example, when F3>F4, a ratio F3/F4 is less than 150, preferably, greater than 1 and less than 100, more preferably, within a range of 1.2 to 58, still more preferably, within a range of 1.25 to 20, as a result of which a remarkable effect is obtained that a unit has high shock-proof properties and no vibration leakage which is caused by vibration.

Especially, to get a miniature unit by shortening a length dimension thereof, F1 and F2 is different from F3 and F4, preferably, F1 and F2 is greater than F3 and F4, namely, F1, F2>F3, F4. Moreover, F4 has a relationship of F4>L1, L3, W3, W4, similarly, F1 and F2 have a relationship of F1, F2>L1, L2, L3, W3, and the second width We has a relationship of We>F4.

In addition, F4 and L2 have a relationship of F4=L2 or F4≠L2, particularly, to get a unit having a resonator with no vibration leakage which is caused by vibration, there is a relationship of F4<L2. In order to shorten a dimension of a length direction of the tuning fork arms 10, 20, F4 may have a relationship of F4≦L1, L3, W3, W4, and to get a unit having a resonator with high shock-proof properties, there may be a relationship of F1, F2≧W and F3<F4. For this case, a ratio F4/F3 is within a range of 1.05 to 1.95.

Moreover, when a sum of a length of an outer side surface of each of the first, second, third and fourth frame portions 1, 2, 3, 4 is defined by a first length dimension Lo, the dimension Lo is given by Lo=a+b+c+d. As an object of this invention is to provide a unit with a length of the maximum side and a mounting area less than that of the prior art, the length of the maximum side of the unit is less than 1.35 mm or equal to 1.35 mm. The length of the maximum side of the unit is less about 15.6% than that (1.6 mm length) of the prior art with a tuning fork resonator, which is housed in an electronic apparatus.

In order to obtain a unit with a mounting area which compares favorably with that of a quartz crystal unit (1.6 mm length×1 mm width=1.6 mm$^2$) having a quartz crystal tuning fork resonator of the prior art or with a mounting area less than that of the prior art, the first length dimension Lo is equal to or less than 5 mm. For example, when Lo is 5 mm, the maximum mounting area is 1.563 mm$^2$ whose value compares favorably with that of the prior art. When Lo is less than 5 mm, it is needless to say that a mounting area is less than that of 1.563 mm$^2$.

In addition, when a sum of a length of an inner side surface of each of the first, second, third and fourth frame portions 1, 2, 3, 4 is defined by a second length dimension Li, the dimension Li is given by Li=A+B+C+D. It is needless to say that a tuning fork resonator is housed in an area having the dimension Li according to the dimension of Li.

Figure 2:
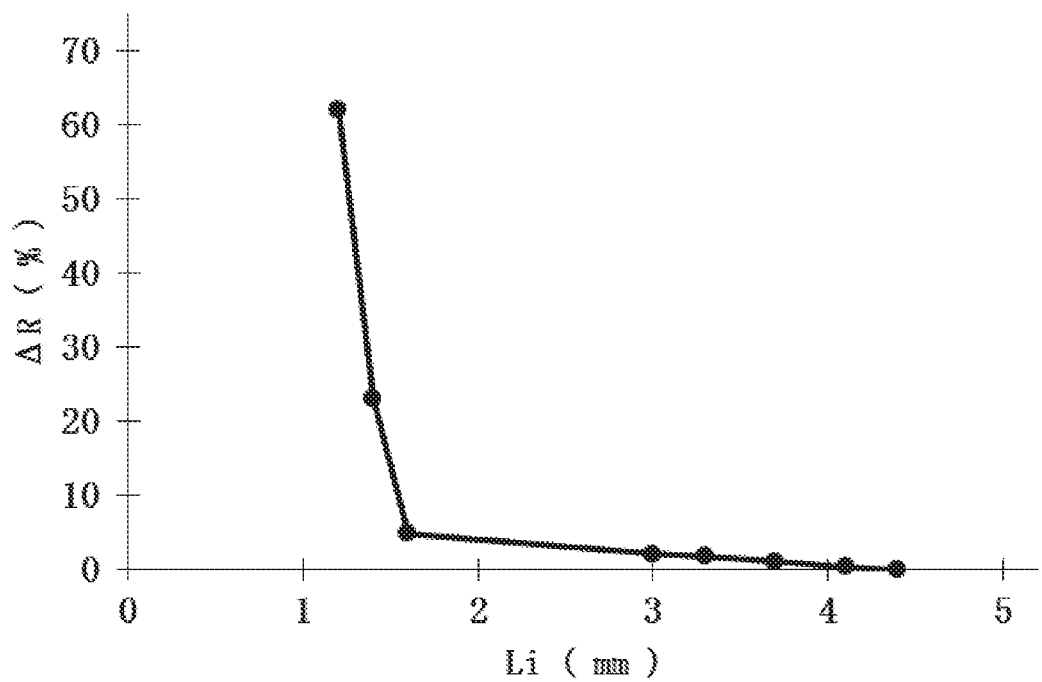
FIG. 2 shows a relationship of a second length dimension Li (mm) and a series resistance deviation $\Delta R$ (%) of the tuning fork resonator in FIG. 1, where $\Delta R$ is defined by $\Delta R = \Delta R1/R1$, and R1 represents a series resistance.

FIG. 2 shows a relationship of the second length dimension Li (mm) and a series resistance deviation ΔR (%), where ΔR is defined by ΔR=ΔR1/R1, and R1 represents a series resistance. In FIG. 2, a normalization is performed by a series resistance R1 of a tuning fork resonator which is housed when Li=4.4 mm.

In more detail, when Li=4.4 mm, ΔR=0, in addition, when Li=4.1 mm, ΔR=0.45%, when Li=3.7 mm, ΔR=1.05%, when Li=3.3 mm, ΔR=1.65%, when Li=3 mm, ΔR=2.1%, and when Li=1.6 mm, ΔR=4.9%. Like this, though ΔR increases gradually according to decrease of Li, it is easily understood that the tuning fork resonator which compares favorably with that of the prior art, is obtained.

However, when Li has a further small value of 1.4 mm, ΔR manifests a sharp increase of 23%, and when Li has a much further small value of 1.2 mm, ΔR manifests a very sharp increase of 62%. From this relation, Li is limited to 1.6 mm to get the tuning fork resonator which compares favorably with that of the prior art.

As described above, though Li is within a range of 1.6 mm to 4.4 mm in FIG. 2, this invention is not limited to this, but includes any range of 1.6 mm to 4.4 mm. For first example, Li is within a range of 1.6 mm to 4.1 mm or within a range of 1.6 mm to 3.7 mm or within a range of 1.6 mm to 3.3 mm or within a range of 1.6 mm to 3 mm. For each case, off course, it is needless to say that a unit is realized with a small ΔR.

For second example, Li is within a range of 1.75 mm to 3.75 mm or within a range of 2.05 mm to 3.85 mm or within a range of 3 mm to 4.4 mm or within a range of 3 mm to 4.1 mm or within a range of 3 mm to 3.7 mm or within a range of 3 mm to 3.3 mm. Of course, for each case, it is needless to say that a unit is obtained with a small mounting area and a small ΔR.

In addition, when a tuning fork resonator has tuning fork arms each of which has an uniform width and a length, and the width of each of tuning fork arms is defined by Wt and the length of each of the tuning fork arms is defined by Lt, there is a relationship of $f=k(Wt/Lt^2)$, where f represents a frequency and k is a constant value which is determined by boundary conditions.

By taking this relationship into account, and when each of tuning fork arms has a first width and a second width greater than the first width at least, namely, when the maximum width of each of the tuning fork arms each of which has a plurality of different widths is defined by Wn and an overall length of each of the tuning fork arms is defined by Ln, a ratio Wn/Ln is within a range of 0.112 to 0.28, preferably, within a range of 0.115 to 0.168 or within a range of 0.176 to 0.26, as a result of which a tuning fork resonator is obtained with decreased vibration leakage which is caused by vibration, a small series resistance R1 and a small motional inductance Lm.

Moreover, a tuning fork resonator has a base portion and tuning fork arms, and when an overall width of the tuning fork resonator, namely, the maximum width of the tuning fork resonator is defined by Wov and an overall length of the tuning fork resonator is defined by Lov, a ratio Wov/Lov is within a range of 0.25 to 0.69, preferably, within a range of 0.25 to 0.28 or within a range of 0.29 to 0.65, more preferably, within a range of 0.29 to 0.345 or within a range of 0.365 to 0.58, as a result of which the tuning fork resonator is obtained with decreased leakage which is caused by vibration, a small capacitance ratio r, a small series resistance R1 and a small motional inductance Lm.

Furthermore, when the ratio Wov/Lov is defined by WLov, namely, WLov=Wov/Lov, there is a close relationship between the ratio WLov and A, B, C and D of the second length dimension Li. To get a unit with high shock-proof properties and a small mounting area, there is a relationship of WLov=D/A and/or WLov=D/B. As there is generally a relationship of A=B and C=D and/or A, B≥C, D, this relationship is taken into account and off course, there is a relationship of A, B>Lov.

In detail, as WLov=D/A is within a range of 0.25 to 0.69 and Li is within a range of 1.6 mm to 4.4 mm, A has a value of 0.64 mm from a relation of D/A=0.25 and Li=1.6 mm, and also A has a value of 1.3 mm from a relation of D/A=0.69 and Li=4.4 mm. Namely, A and/or B is within a range of 0.64 mm to 1.3 mm. Similar to this, when Li is within a range of 1.6 mm to 4.2 mm, A and/or B is within a range of 0.64 mm to 1.24 mm. As a result, a unit with a length of the maximum side less than 1.35 mm is obtained with a tuning fork resonator having high shock-proof properties, a small mounting area, decreased vibration leakage which is caused by vibration, a small series resistance R1 and a small motional inductance Lm. Namely, the unit can be realized with a length dimension of the unit, which is less than 1.35 mm.

Namely, it is needless to say that A and/or B are/is derived from a relationship of WLov and Li so that A and/or B are/is less than 1.3 mm to get a unit with a length dimension less than 1.35 mm.

In more detail, for first example, when WLov is within a range of 0.25 to 0.69 and Li is within a range of 1.6 mm to 4.4 mm, A and/or B are/is within a range of 0.64 mm to 1.3 mm, preferably, 0.64 mm to 1.24 mm, more preferably, within a range of 0.64 mm to 1.19 mm, still more preferably, within a range of 0.72 mm to 1.14 mm.

For second example, when WLov is within a range of 0.25 to 0.69 and Li is within a range of 1.6 mm to 4.1 mm, A and/or B are/is within a range of 0.64 mm to 1.21 mm, preferably, 0.72 mm to 1.14 mm, more preferably, within a range of 0.72 mm to 1.1 mm.

For third example, when WLov is within a range of 0.25 to 0.69 and Li is within a range of 1.6 mm to 3.7 mm, A and/or B are/is within a range of 0.64 mm to 1.09 mm, preferably, 0.72 mm to 1.09 mm, more preferably, within a range of 0.72 mm to 1 mm.

For fourth example, when WLov is within a range of 0.25 to 0.69 and Li is within a range of 1.6 mm to 3.3 mm, A and/or B are/is within a range of 0.64 mm to 0.98 mm.

For fifth example, when WLov is within a range of 0.25 to 0.69 and Li is within a range of 1.6 mm to 3 mm, A and/or B are/is within a range of 0.64 mm to 0.89 mm.

For sixth example, when WLov is within a range of 0.29 to 0.65 and Li is within a range of 1.75 mm to 3.75 mm, A and/or B are/is within a range of 0.68 mm to 1.14 mm, preferably, within a range of 0.68 mm to 1.08 mm.

For seventh example, when WLov is within a range of 0.365 to 0.58 and Li is within a range of 2.05 mm to 3.85 mm, A and/or B are/is within a range of 0.75 mm to 1.22 mm, preferably, within a range of 0.75 mm to 1.08 mm.

In the relation described above, a remarkable effect is obtained that a unit with a length of the maximum side less than 1.35 mm can be obtained with a tuning fork resonator having high shock-proof properties, a small mounting area, very decreased vibration leakage, a small series resistance R1 and a small motional inductance Lm.

In addition, this invention is not limited to the relations among WLov, Li and A and/or B described above, but includes the combined relations. As a result, the outstanding effect is obtained as well.

Like this, a relationship of A B and C=D is used in this embodiment, but, when a difference of A and B and a difference of C and D is slightly, the above-described relations is, off course, true, and also is included in this invention.

Figure 3:
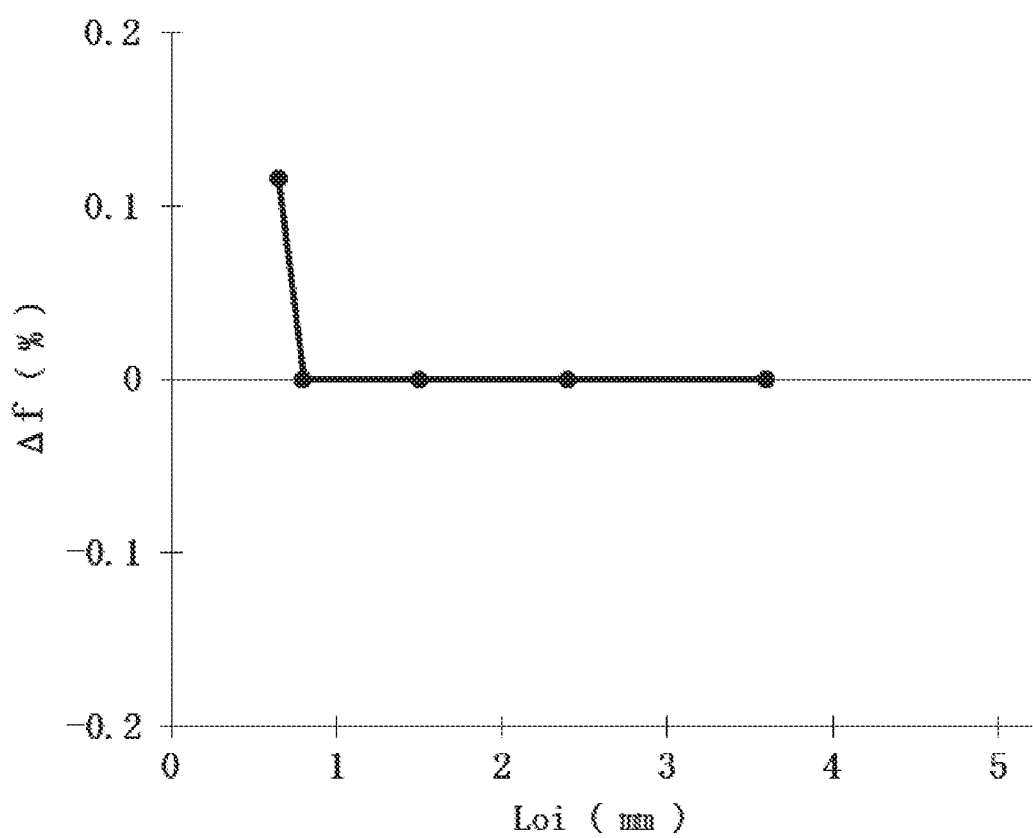
FIG. 3 shows a relationship of a dimension difference Loi (mm) and a frequency deviation $\Delta f$ (%) of the tuning fork resonator in FIG. 1, where $\Delta f$ is defined by $\Delta f = \Delta f1/f1$, and f1 represents a frequency.

FIG. 3 shows a relationship of a dimension difference Loi (mm) and a frequency deviation $\Delta f$ (%), where Loi is defined by Loi=Lo−Li, Lo represents the first length dimension, Li represents the second length dimension, $\Delta f$ is defined by $\Delta f=\Delta f1/f1$, and f1 represents a frequency.

In FIG. 3, when Loi=3.6 mm, a normalization is performed by a frequency f1 of a tuning fork resonator, namely, when Loi=3.6 mm, $\Delta f=0$. In addition, even if a value of Loi decreases gradually so that Loi=2.4 mm, 1.5 mm, and 0.8 mm, the frequency deviation $\Delta f$ is almost zero, like this, it is easily understood that the frequency of the tuning fork resonator is very stable between Li=0.8 mm and Li=2.4 mm as shown in FIG. 3.

However, when Loi=0.65 mm, $\Delta f$ has a value of 0.116%, namely, the frequency changes very sharply. As one of the reasons, it is very conceivable that the tuning fork resonator has a loss of vibration energy by vibration leakage which is caused by vibration. When this frequency deviation is converted to the loss of the vibration energy, it is equivalent to about 0.23%. From this relation, the lower limit of Loi has a value of 0.8 mm. In addition, the lower limit of the first length dimension Lo has a value of 2.4 mm from a relation of Loi=0.8 mm and Li=1.6 mm.

Similar to this, the upper limit of the second length dimension Li has a value of 4.2 mm from a relation of Loi=0.8 mm and Lo=5 mm. In other words, the first length dimension Lo is within a range of 2.4 mm to 5 mm, and the second length dimension Li is within a range of 1.6 mm to 4.2 mm.

In addition, Loi is within a range of 0.8 mm to 3.4 mm, in detail, Loi=0.8 mm is obtained from Lo=5 mm minus Li=4.2 mm, and also Loi=3.4 mm is obtained from Lo=5 mm minus Li=1.6 mm. In other words, Loi is equal to or less than 3.4 mm, and is equal to or greater than 0.8 mm, namely, 0.8 mm≤Loi≤3.4 mm. As a result, there is a remarkable effect that a small-sized unit is obtained with the tuning fork resonator having no frequency deviation and a small mounting area by providing the relation of the Loi described above. But, when the tuning fork resonator must satisfy some conditions as will be described below, Loi has a value of 3.6 mm.

Like this, though the detail is above-described, this invention is not limited to the unit of the numerical limits described above, but, in particular, may include a slightly large tuning fork resonator, when a unit is required with the tuning fork resonator having a smaller series resistance R1 and a smaller motional inductance L1.

Namely, the upper limit of the second length dimension Li changes to 4.4 mm from 4.2 mm. For this case, the upper length dimension of the first length dimension Lo changes to 5.2 mm from 5 mm from the relation of Loi=0.8 mm and Li=4.4 mm. As Loi=3.6 mm is obtained from Lo=5.2 mm minus Li=1.6 mm, there is a relationship of 0.8 mm≤Loi≤3.6 mm.

As a result, a unit can be realized with the tuning fork resonator having the smaller series resistance R1 and the smaller motional inductance L1. The maximum mounting area of the unit for this case has a value of 1.69 mm$^2$, and it is easily understood that the value compares favorably with the mounting area 1.6 mm$^2$ of the unit of the prior art.

In addition, the lower limit of the maximum length dimension of a frame (unit) is determined from the first length dimension Lo=2.4 mm, Namely, the lower limit has a value of 0.95 mm by taking into account shock-proof properties and a mounting area. In other words, the dimension of the maximum side of the unit is within a range of 0.95 mm to 1.35 mm, preferably, within a range of 0.95 mm to 1.1 mm to get a decreased mounting area of the unit.

In the embodiment described above, though there is a relationship of A=B and/or C=D, this invention is not limited to this, but there may be a relationship of A≠B and/or C≠D. In other words, there is a relationship of A>B or A<B and/or C>D or C<D, and C and D are within a range of 0.32 mm 0.8 mm, preferably, within a range of 0.32 mm to 0.75 mm, more preferably, within a range of 0.35 mm to 0.48 mm or 0.55 mm to 0.65 mm to get a unit with a small mounting area.

By limiting the first length dimension and the second length dimension, there is a remarkable effect that a piezoelectric unit having a tuning fork resonator, a case and a lid, and also a very small mounting area is obtained with the tuning fork resonator having a small motional inductance Lm, a small capacitance ratio r, a small series resistance R1, excellent aging characteristics, high shock-proof properties and a decreased energy loss by leakage which is caused by vibration.

In addition, there is a further remarkable effect that rise-up time of an output signal of an oscillator comprising the tuning fork resonator of this invention gets short.

Moreover, the tuning fork arms 10, 20, the base portion 30, the connecting portion 40 and the frame having the first, second, third and fourth frame portions 1, 2, 3, 4 of the tuning fork resonator 100 are formed integratedly. Though the tuning fork resonator 100 has two tuning fork arms, it may have more than two, namely, at least two tuning fork arms.

Furthermore, though the base portion 30 is connected to the third frame portion 3 through the connecting portion 40, this invention is not limited to this, but may include the base portion 30 directly connected to the frame portion 3.

Though the tuning fork resonator in the embodiment described above comprises the first and second vibrational portions each having a different width, this invention is not limited to this, but may comprises a third vibrational portion formed between the first and second vibrational portions and having a width different from that of each of the first and second vibrational portions or vibrational portions having two or more than two formed between the first and second vibrational portions which include third and fourth vibrational portions each having a different width.

In other words, the vibrational portions comprise third, fourth, fifth, sixth and N1 vibrational portions, where N1 is an integer 7 or more than 7. For example, when N1=10, the vibrational portions comprise the third vibration to a tenth vibrational portion. Namely, they comprise the third vibrational portion to a N2 vibrational portion, where N2 is an integer 4 or more than 4.

For first example, when the third vibrational portion having a third width and a third length is formed between the first vibrational portion having the width W and the length L, and second vibrational portion having the second width We greater than the first width W and the second length Le less than the first length L, the third width is greater than the first width W and less than the second width We, and the third length is less than the first length L and the second length Le or less than the first length L and greater than the second length Le.

In addition, when a sum of the second length Le of the second vibrational portion and the third length of the third vibrational portion is defined by a length L4, the length L4 is less than the first length L of the first vibrational portion. When the third vibrational portion is formed between the first and second vibrational portions, a ratio We/W of the second width We and the first width W of each of the tuning fork arms 10, 20 is within a range of 3.3 to 6.1, preferably, within a range of 3.3 to 5.9.

Similar to this, when a sum of the first length L of the first vibrational portion and the second length Le of the second vibrational portion of each of the tuning fork arms 10, 20 is defined by a length Lt, the length Lt is within a range of 0.45 mm to 0.92 mm, preferably, 0.45 mm to 0.88 mm, more preferably, 0.54 mm to 0.83.

As there is a close relationship between a resonator shape and a resonator dimension to get a time which an output signal of an oscillator comprising a tuning fork resonator reaches a constant value, and therefore, the time which the output signal reaches about 80% of the constant value in this invention is called a rise-up time. When the ratio We/W is 3.3 and the length Lt is 0.45 mm, the rise-up time is about 0.3 seconds, and also when the ratio We/W is 6.1 and the length Lt is 0.92 mm, the rise-up time is about 0.7 seconds.

Like this, there is a remarkable effect that the oscillator can be obtained with the short rise-up time, even when the tuning fork resonator is smaller than that of the prior art. It is, therefore, needless to say that this result compares favorably with that of the prior art.

However, this invention is not limited to this, but may include the third length of the third vibrational portion substantially equal to zero in this embodiment.

In other words, each of the tuning fork arms 10, 20 comprises a plurality of vibrational portions having a first vibrational portion including a first width W and a first length L, and a second vibrational portion including a second width We greater than the first width W and a second length Le less than the first length L, and also has the length Lt defined by Lt=L+Le. Namely, the length Lt is an overall length of each of the tuning fork arms 10, 20.

For second example, when the third vibrational portion having a third width and a third length, and the fourth vibrational portion having a fourth width and a fourth length are formed between the first vibrational portion having the first width W and the second vibrational portion having the second width We, each of the third and fourth widths or at least one of the third and fourth widths is greater than the first width W and less than the second width We, and each of the third and fourth lengths or at least one of the third and fourth lengths is less than the first length L and the second length Le.

Namely, the third vibrational portion to the N2 vibrational portion having a N2 width and a N2 length (N2 is 4 or more than 4) are formed between the first and second vibrational portions, each of the third width and the N2 width or at least one of the third width and the N2 width is greater than the first width W and less than the second width We, and each of the third length and the N2 length or at least one of the third length and the N2 length is less than the first length L and the second length Le.

In order to get a rise-up time of 0.3 seconds to 0.7 seconds for this case, the ratio We/W of each of the tuning fork arms 10, 20 is within a range of 3.4 to 6.3, preferably, within a range of 3.4 to 6.1, and also the length Lt is within a range of 0.45 mm to 0.92 mm, preferably, within a range of 0.45 mm to 0.88 mm.

In addition, though the frame of the tuning fork resonator described above is comprised of the four frame portions having the first, second, third and fourth frame portions at least, this invention is not limited to this, but may have a frame comprised of more than the four frame portions, e.g. five frame portions or six frame portions or seventh frame portions or eight frame portions and so on.

Moreover, though the inner and outer side surfaces of each of the four frame portions have a linear portion in a plan view of the tuning fork resonator, this invention is not limited to this, but may have the side surfaces of each of the four frame portions which has any shape portion, e.g. such as a curve shape portion, a concave shape portion, a convex shape portion and a cut portion.

For this case, each of the first length dimension Lo and the second length dimension Li may have a dimension comprised of the linear portions of the side surfaces each not including the curve shape portion, the concave shape portion, the convex shape portion and the cut portion in the plan view or each including the curve shape portion, the concave shape portion, the convex shape portion, and the cut portion in the plan view. This invention includes both.

In FIG. 1, for first example, through the frame has four corners and each of the four corners is not cut, this invention is not limited to this, but may have the four corners each of which has any shape cut such as linear cut or rounded cut or curved cut in the plan view. For this case, the first length dimension Lo is a length dimension not including a portion of any shape cut, but this invention may have a length dimension including the portion of any shape cut, even though each of the four corners has any shape cut.

In addition to this, a portion of intersection of the corresponding side surfaces of the four frame portions is cleanly shown in FIG. 1, but, when the four frame portions are actually formed in a chemical etching process, e.g., a portion of intersection of a first inner side surface of the first frame portion and a fourth inner side surface of the fourth frame portion has a complicated shape because the four frame portions are made of an anisotropic material such as quartz crystal which has an etching speed different in a direction of each of three crystal axes which have a X-axis (electrical axis), a Y-axis (mechanical axis) and a Z-axis (optical axis).

Therefore, the second length dimension Li is a length dimension for designing a shape of the frame as shown in FIG. 1.

In FIG. 1, for second example, though a rectangular shape with four angles each of which has 90 degrees, is formed by an inner side surface of each of the four frame portions, this invention is not limited to this, but may have any shape different from the rectangular shape and a square shape with four angles each of which has 90 degrees. For this case, the any shape has at least four inner side surfaces and at least four angles at least two of which is different from 90 degrees, e.g., the at least two angles are greater than 90 degrees, namely, have an obtuse angle or less than 90 degrees, namely, have an acute angle. In addition, this invention may also include a quadrangle having four inner side surfaces and four angles each of which is different from 90 degrees.

In addition to this, this invention may also have a polygon including a quadrangle with four inner side surfaces, a pentagon with five inner side surfaces, a hexagon with six inner side surfaces, a heptagon with seven inner side surfaces, an octagon with eight inner side surfaces, a nonagon with nine inner side surfaces and so on.

In detail, the polygon has inner side surfaces more than 3, preferably, more than 4, more preferably, equal to N, where N is an even number equal to 6 or more than 6, e.g. when N is 6, a hexagon is formed with six inner side surfaces and six angles at least four of which have an obtuse angle, e.g., greater than 95 degrees and less than 160 degrees, preferably, within a range of 100 degrees to 150 degrees, more preferably, within a range of 110 degrees to 140 degrees. As a result of which there is provided an outstanding effect that each of the six inner side surfaces is formed cleanly like a designed shape in a chemical etching process because the at least four of the six angles have an obtuse angle.

In this embodiment, a frame with four frame portions has four outer side surfaces and six inner side surfaces with six angles at least four of which have an obtuse angle.

Though the frame has the first, second, third and fourth frame portions including the first, second, third and fourth inner side surfaces as shown in FIG. 1, a fifth inner side surface is actually formed from a shape of FIG. 1 between an outer edge of the first inner side surface of the first frame portion and an outer edge of the fourth inner side surface of the fourth frame portion in the plan view so that there are provided two angles each having an obtuse angle, namely, one of the two angles (first angle) is formed by the first inner side surface of the first frame portion and the fifth inner side surface and the other of the two angles (second angle) is formed by the fourth inner side surface of the fourth frame portion and the fifth inner side surface.

Similar to this, a sixth inner side surface is also formed from the shape of FIG. 1 between an outer edge of the second inner side surface of the second frame portion and an outer edge of the fourth inner side surface of the fourth frame portion in the plan view so that there are provided two angles each having an obtuse angle, namely, one of the two angles (third angle) is formed by the second inner side surface of the second frame portion and the sixth inner side surface and the other of the two angles (fourth angle) is formed by the fourth inner side surface of the fourth frame portion and the sixth inner side surface.

Namely, a first portion has first, second and third side surfaces, and the first side surface of the first portion is connected to the first inner side surface of the first frame portion, the second side surface of the first portion is connected to the fourth inner side surface of the fourth frame portion, and the third side surface of the first portion which corresponds with the fifth inner side surface is formed between the first inner side surface of the first frame portion and the fourth inner side surface of the fourth frame portion so that a first angle is formed by the first inner side surface of the first frame portion and the fifth inner side surface and a second angle is formed by the fourth inner side surface of the fourth frame portion and the fifth inner side surface.

In addition, a second portion has fourth, fifth and sixth side surfaces, and the fourth side surface is connected to the second inner side surface of the second frame portion, the fifth side surface is connected to the fourth inner side surface of the fourth frame portion, and the sixth side surface which corresponds with the sixth inner side surface is formed between the second inner side surface of the second frame portion and the fourth inner side surface of the fourth frame portion so that a third angle is formed by the second inner side surface of the second frame portion and the sixth inner side surface and a fourth angle is formed by the fourth inner side surface of the fourth frame portion and the sixth inner side surface.

In addition to this, when N is 8, a seventh inner side surface and an eighth inner side surface are added at a shape of N=6 already described above.

In detail, the seventh inner side surface is also formed from the shape of FIG. 1 between an outer edge of the first inner side surface of the first frame portion and an outer edge of the third inner side surface of the third frame portion in the plan view so that there are provided two angles each having an obtuse angle, namely, one of the two angles (fifth angle) is formed by the first inner side surface of the first frame portion and the seventh inner side surface and the other of the two angles (sixth angle) is formed by the third inner side surface of the third frame portion and the seventh inner side surface.

On the other hands, the eighth inner side surface is also formed from the shape of FIG. 1 between an outer edge of the second inner side surface of the second frame portion and an outer edge of the third inner side surface of the third frame portion in the plan view so that there are provided two angles each having an obtuse angle, namely, one of the two angles (seventh angle) is formed by the second inner side surface of the second frame portion and the eighth inner side surface and the other of the two angles (eighth angle) is formed by the third inner side surface of the third frame portion and the eighth inner side surface.

Namely, a third portion has seventh, eighth and ninth side surfaces, and the seventh side surface of the third portion is connected to the first inner side surface of the first frame portion, the eighth side surface is connected to the third inner side surface of the third frame portion, and the ninth side surface which corresponds with the seventh inner side surface is formed between the first inner side surface of the first frame portion and the third inner side surface of the third frame portion so that a fifth angle is formed by the first inner side surface of the first frame portion and the seventh inner side surface and a sixth angle is formed by the third inner side surface of the third frame portion and the seventh inner side surface.

In addition to this, a fourth portion has tenth, eleventh and twelfth side surfaces, and the tenth side surface of the fourth portion is connected to the second inner side surface of the second frame portion, the eleventh side surface is connected to the third inner side surface of the third frame portion, and the twelfth side surface which corresponds with the eighth inner side surface is formed between the second inner side surface of the second frame portion and the third inner side surface of the third frame portion so that a seventh angle is formed by the second inner side surface of the second frame portion and the eighth inner side surface and an eighth angle is formed by the third inner side surface of the third frame portion and the eighth inner side surface.

In more detail, when N is 8, an octagon is formed with eight inner side surfaces and eight angles each of which have an obtuse angle, e.g., greater than 95 degrees and less than 160 degrees, preferably, within a range of 100 degrees to 150 degrees, more preferably, within a range of 110 degrees to 140 degrees. As a result of which there is provided an outstanding effect that each of the eight inner side surfaces is formed cleanly like a designed shape in a chemical etching process because each of the eight angles have an obtuse angle.

In this embodiment, the frame with four frame portions has four outer side surfaces and eight inner side surfaces with eight angles each of which has an obtuse angle which is greater than 90 degrees and less than 180 degrees.

Like this, the fifth and sixth inner side surfaces or the fifth, sixth, seventh and eighth inner side surfaces are formed from the shape of FIG. 1, and the frame has the six inner side surfaces or the eight inner side surfaces in which the tuning fork arms 10, 20 and the base portion 30 is housed, namely, surrounded by the six inner side surfaces or the eight inner side surfaces. Therefore, the second length dimension Li of the present invention is a length dimension defined by Li=A+B+C+D as shown in FIG. 1, even when the frame has the six inner side surfaces or the eight inner side surfaces because the fifth and sixth inner side surfaces or the fifth, sixth, seventh and eighth inner side surfaces are formed from the shape of FIG. 1.

As described in FIG. 1, though the first, second, third and fourth frame portions 1, 2, 3 and 4 have, respectively, the widths F1, F2, F3 and F4 each of which is constant, this invention is not limited to this, but may have the first, second, third and fourth frame portions each of which has a first portion including a first width and a second portion including a second width different from the first width, namely, greater than the first width or less than the first width.

For example, the first frame portion has the first portion including the first width F1 at the central portion and the second portion including the second width greater than the first width F1 at an arbitrary portion in a direction of an end portion of the first frame portion. Needless to say, this concept is applicable to each of the second, third and fourth frame portions.

In addition to this, this invention is not limited to the contents described in FIG. 1, e.g., when the frame has six inner side surfaces or eight inner side surfaces, each of W4, W5, W6, W8 and W9 is a distance in the width direction measured from an outer edge of the corresponding portion of a tuning fork resonator to an outer edge of an inner side surface of the frame adjoining the outer edge of the corresponding portion of the resonator, and also L3 is a distance in the length direction measured from an outer edge of the corresponding portion of a tuning fork resonator to an outer edge of an inner side surface of the frame adjoining the outer edge of the corresponding portion of the resonator.

With respect to the six and eight inner side surfaces, though the detail is described above using the shape of FIG. 1, however, this invention is not limited to this, but may have the second length dimension Li which is a length dimension of a sum of a length of each of the six inner side surfaces of the frame or the eight inner side surfaces or the N inner side surfaces of the frame.

As described above, however, though N has an even number in this embodiment, this invention is not limited to this, but may have N which is an odd number, e.g., N has the odd number of 5, 7, 9, 11, 13 and so forth.

Figure 4:
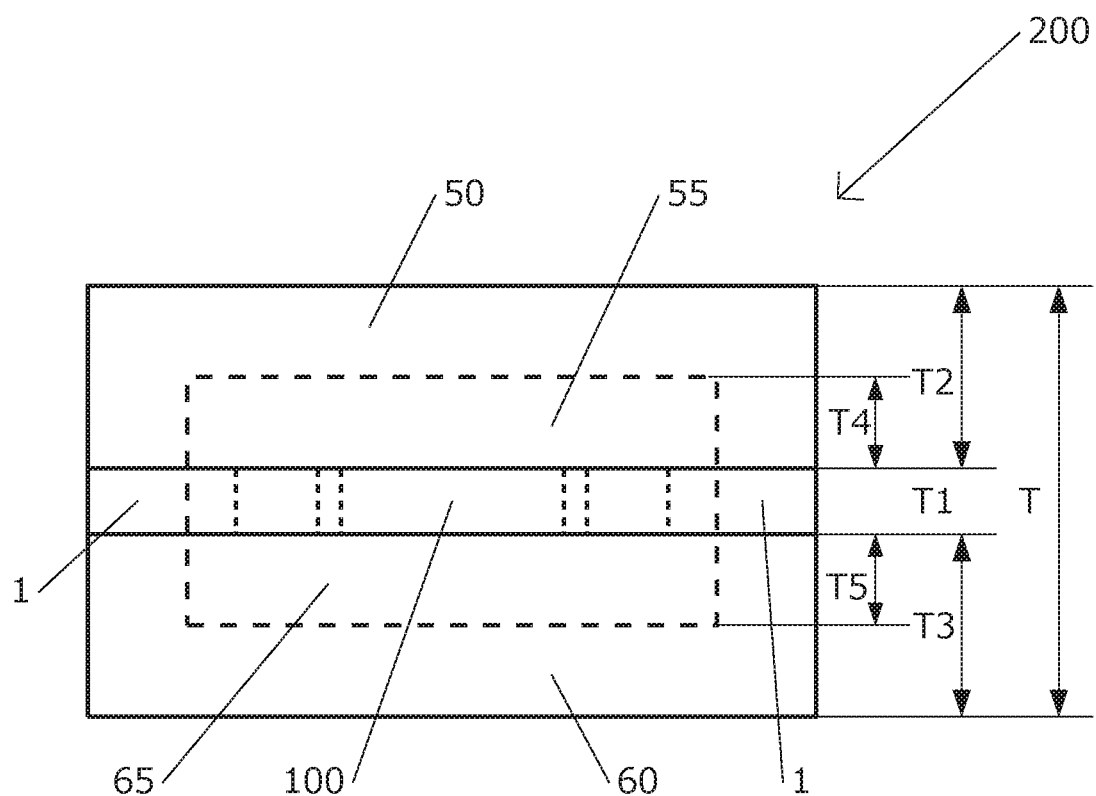
FIG. 4 shows a side view of a piezoelectric unit in a first embodiment of the present invention.

FIG. 4 shows a side view of a piezoelectric unit 200 in a first embodiment of the present invention. The unit 200 comprises the tuning fork resonator 100 described above, a case 60 and a lid 50. The first frame portion 1 of the tuning fork resonator 100 is formed between the case 60 and the lid 50, and the case 60 has an interior space 65 and similarly, the lid 50 has an interior space 55.

In addition, the tuning fork resonator has a thickness of T1, the case 60 has a thickness of T3 and the interior space 65 of the case 60 has a depth of T5, while the lid 50 has a thickness of T2 and the interior space 55 of the lid 50 has a depth of T4. A thickness T of the unit 200 is, therefore, given by T=T1+T2+T3, and the thickness T is equal to or less than 0.6 mm, preferably, equal to or greater than 0.2 mm and equal to or less than 0.5 mm, namely, 0.2 mm≤T≤0.5 mm, more preferably, equal to or greater than 0.25 mm and equal to or less than 0.38 mm, namely, 0.25 mm≤T≤0.38 mm.

In more detail, each of the case 60 and the lid 50 has first, second, third and fourth mounting portions, and the first frame portion 1 of the tuning fork resonator 100 is mounted on the first mounting portion of each of the case 60 and the lid 50 so that the first frame portion is located between the first mounting portion of the case and the first mounting portion of the lid. Similar to this, the second frame portion 2 of the tuning fork resonator 100 is mounted on the second mounting portion of each of the case 60 and the lid 50 so that the second frame portion is located between the second mounting portion of the case and the second mounting portion of the lid.

In addition, the third frame portion 3 of the tuning fork resonator 100 is mounted on the third mounting portion of each of the case 60 and the lid 50 so that the third frame portion is located between the third mounting portion of the case and the third mounting portion of the lid. Similar to this, the fourth frame portion 4 of the tuning fork resonator 100 is mounted on the fourth mounting portion of each of the case 60 and the lid 50 so that the fourth frame portion is located between the fourth mounting portion of the case and the fourth mounting portion of the lid.

In order to get the tuning fork resonator with a small series resistance R1, the resonator is housed in a vacuum. It is needless to say that the unit 200 also has the first length dimension Lo, the second length dimension Li and the dimension difference Loi already described above.

Though the unit 200 has the tuning fork resonator with the four frame portions including the first, second, third and fourth frame portions, this invention is not limited to this, but includes a tuning fork resonator with more than four frame portions, i.e. five, six, seven frame portions and so forth. For this case, each of the case and lid has mounting portions more than four, for example, when the tuning fork resonator has five frame portions including a fifth frame portion from a first frame portion, and each of the case and the lid has five mounting portions including a fifth mounting portion from a first mounting portion, each of the five frame portions is mounted on the corresponding mounting portion of each of the case and the lid so that the five frame portions are located between the case and the lid.

Similar to this, each of the sixth and seventh frame portions is mounted on the corresponding mounting portion of each of the case and the lid so that the sixth and seventh frame portions are located between the case and the lid.

In order to get the unit with the tuning fork resonator which is not influenced by an acoustic effect, and having a small series resistance R1, a small motional inductance Lm and high shock-proof properties, a depth T5 of the case has a relationship of $T3/6<T5<(3T3)/4$. Similarly, a depth T4 of the lid has a relationship of $T2/6<T4<(3T2)/4$, preferably, the depth T5 of the case has a relationship of $T3/5<T5<T3/2$ and also, the depth T4 of the lid has a relationship of $T2/5<T4<T2/2$.

In addition, T4 may be equal to T5 or may be different from T5, namely, there is a relationship of T4=T5 or T4>T5 or T4<T5. Especially, to get the unit with the tuning fork resonator with no acoustic effect, a relationship of T4≤T5 is preferable.

Concretely, each of the depth T5 of the case 60 and the depth T4 of the lid 50 is within a range of 0.01 mm to 0.2 mm, preferably, 0.015 mm to 0.18 mm, more preferably, within a range of 0.02 mm to 0.15 mm. In addition to this, T2 and T3 are equal to or greater than 0.06 mm and equal to or less than 0.27 mm preferably, within a range of 0.08 mm to 0.16 mm.

In order to decrease a distortion among the tuning fork resonator, the case and the lid of the unit which is caused by a variation of temperature, there is a relationship of T1=T2=T3. However, this invention is not limited to this, but may have a relationship of T1≠T2, T3, namely, T1>T2, T3 or T1<T2, T3 or may have a relationship of T2=T3 or T2≠T3, namely, T2>T3 or T2<T3. In particular, to get the unit having the tuning fork resonator with no distortion by a variation of temperature and high shock-proof properties, a relationship of T1≤T2, T3 and T2≤T3 is preferable.

For instance, the tuning fork resonator comprises a quartz crystal tuning fork resonator made of quartz crystal or a piezoelectric tuning fork resonator made of a piezoelectric material, and the case and the lid are made of a crystal material such as quartz crystal and so on.

In addition, the quartz crystal tuning fork resonator, the case and the lid are formed using at least one of chemical, physical and mechanical etching methods, e.g. the quartz crystal tuning fork resonator is integratedly formed with a plurality of tuning fork arms, a base portion and a frame in a chemical etching process, and a piezoelectric unit comprised of the quartz crystal tuning fork resonator, the case and the lid is called "quartz crystal unit".

In addition to this, the case and the lid are formed by using an etching process which includes a chemical etching process, in detail, an external shape and a groove of each of the case and lid are formed in an etching process so that the lid and the case have the depths T4 and T5, respectively, therefore, each of the lid and the case has an etched surface, and also, when chemically etched, each of the lid and the case has a chemically etched surface, As fully described in FIG. 4, the lid and the case have constant depths T4 and T5, respectively. However, this invention is not limited to this, but may have a lid and a case each having a different depth, e.g., each of the lid and the case has a first depth portion including a first depth and a second depth portion including a second depth different from the first depth, namely, the second depth is greater than or less than the first depth.

In other words, when a portion having the etched surface or the chemically etched surface of each of the lid and the case is defined by a groove portion, the groove portion has a first groove portion including a first thickness and a second groove portion including a second thickness greater than the first thickness.

For example, when a resonator with tuning fork arms and a base portion connected to the tuning fork arms is needed without an acoustic effect which is caused by vibration, the second groove portion is located at the side of the base portion, namely, a depth of the first groove portion is greater than that of the second groove portion, while when a resonator with tuning fork arms and a base portion connected to the tuning fork arms is needed with high shock-proof properties, the first groove portion is located at the side of the base portion, namely, not at the side of free end portions of the tuning fork arms.

In addition to this, the groove portion may have a third groove portion including a third thickness greater than the second thickness or less than the first thickness or greater than the first thickness and less than the second thickness.

Moreover, though the tuning fork resonator 100 and the unit 200 with the tuning fork resonator of the present invention are above-described in detail, this invention is not limited to this, but includes a dimension of a case housing various tuning fork resonators including the tuning fork resonator 100 described above to which the first length dimension Lo, the second length dimension Li and the dimension difference Loi are applicable.

For this case, each of the various tuning fork resonators is mounted on a mounting portion in an interior space of the case and a lid is connected to an open end of the case to get the interior space of a vacuum. In other words, the lid is connected to the case to cover the open end of the case in a vacuum. Namely, each of the various tuning fork resonators is housed in the case.

In detail, the first length dimension Lo is equivalent to a length dimension of outer side surfaces of the case and the second length dimension Li is equivalent to a length dimension of inner side surfaces of the case. Therefore, the length dimension of the outer side surfaces of the case is defined by Lo, and the length dimension of the inner side surfaces of the case is defined by Li. Needless to say, a dimension difference of the length dimension of the outer side surfaces of the case and the length dimension of the inner side surfaces of the case is defined by Loi, and also the dimension difference Loi is defined by Loi=Lo−Li.

Figure 5:
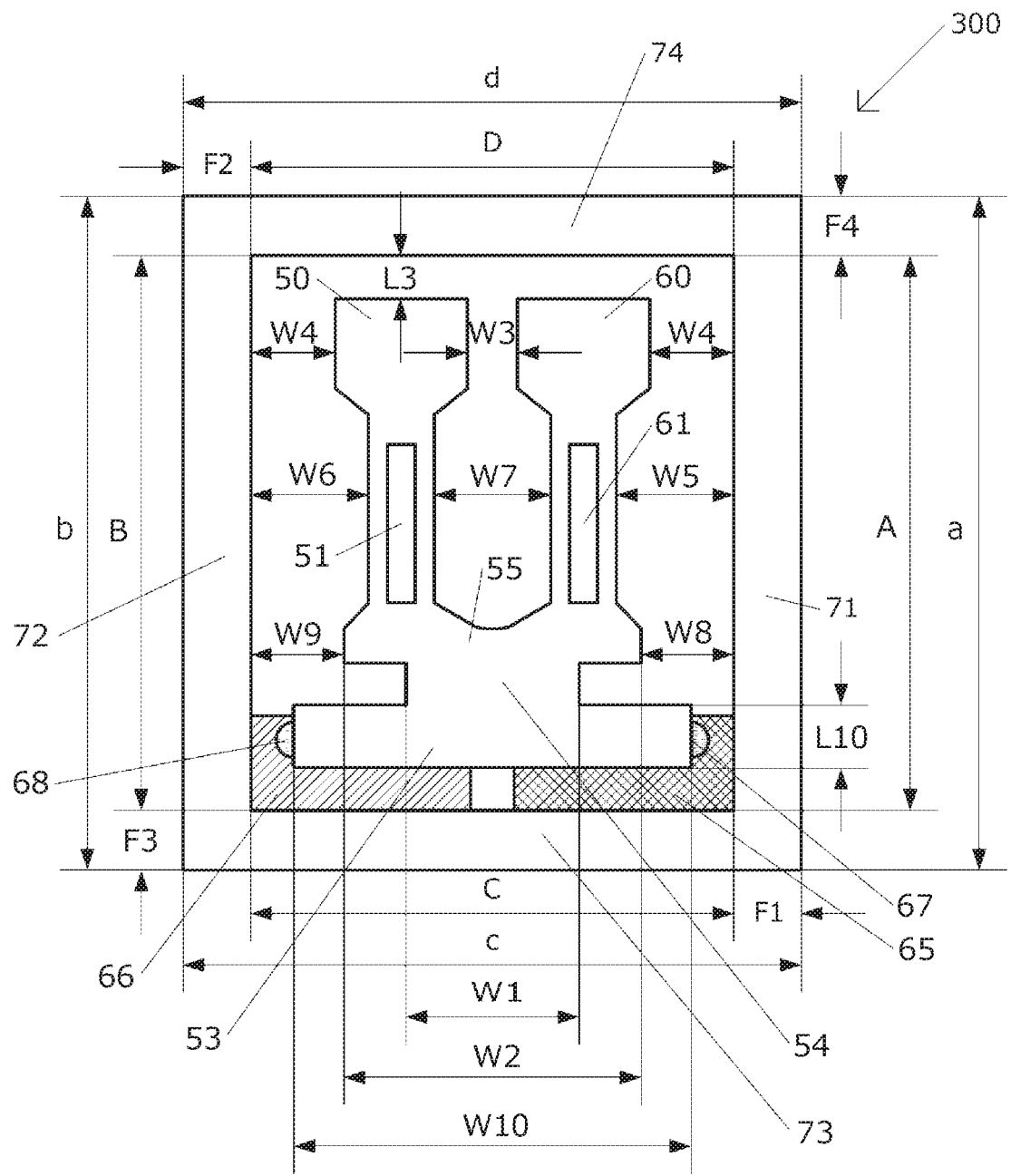
FIG. 5 shows a plan view of a unit in a second embodiment of the present invention, and omitting a lid.

In more detail, a unit 300 comprises a case with a first case portion 71, a second case portion 72, a third case portion 73 and a fourth case portion 74, as shown in FIG. 5 which shows a plan view of the unit 300 in a second embodiment of the present invention, and omitting a lid, and the first case portion 71 and the second case portion 72 extend in a common direction with tuning fork arms 50, 60 outside the tuning fork arms 50, 60. In addition to this, the first case portion 71 is connected to the second case portion 72 through the third case portion 73 and the fourth case portion 74.

Moreover, a length of each of the outer side surfaces of the fourth case portion from the first case portion of the case is given by a, b, c and d, respectively, and when the first length dimension Lo of the case has a relationship of Lo=a+b+c+d, the first length dimension Lo is within a range of 2.4 mm to 5 mm.

Furthermore, a length of each of the inner side surfaces of the fourth case portion from the first case portion of the case is given by A, B, C and D, respectively, and when the second length dimension Li of the case has a relationship of Li=A+B+C+D, the second length dimension Li is within a range of 1.6 mm to 4.2 mm, and a lid is connected to an open end of each of the fourth case portion from the first case portion of the case.

As shown in FIG. 5, the first case portion has a width F1, the second case portion has a width F2, the third case portion has a width F3 and the fourth case portion has a width F4. For example, when a tuning fork resonator has a base portion 55 or a base portion 55 and a frame portion 53 connected to the base portion 55 through a connecting portion 54, the frame portion 53 has a width W10 and a length L10 and is mounted on two mounting portions 65, 66 of the case, and a plurality of tuning fork arms (vibrational arms) having first and second tuning fork arms 50, 60 are connected to the base portion 55.

In detail, the frame portion 53 has first and second portions, and the first portion of the frame portion 53 is mounted on an electrode disposed on the mounting portion 65 by an adhesive 67, actually, the adhesive 67 is located between the first portion and the electrode disposed on the mounting portion 65, while the second portion of the frame portion 53 is mounted on an electrode disposed on the mounting portion 66 by an adhesive 68, actually, the adhesive 68 is located between the second portion and the electrode disposed on the mounting portion 66.

In more detail, the first portion of the frame portion 53 is mounted on the adhesive 67 located on the electrode disposed on the mounting portion 65 and the second portion of the frame portion 53 is mounted on the adhesive 68 located on the electrode disposed on the mounting portion 66. In addition to this, the electrode disposed on the mounting portion 65 has an electrical polarity opposite to an electrical polarity of the electrode disposed on the mounting portion 66 to form two electrode terminals.

However, though the frame portion 53 is mounted on the mounting portions 65, 66, this invention is not limited to this, but may have the base portion 55 which is mounted on two electrodes disposed on two mounting portions 65, 66 of the case so that one of the two electrodes has an electrical polarity opposite to an electrical polarity of the other of the two electrodes and two electrode terminals are formed with a first electrode terminal and a second electrode terminal.

In FIG. 5, a symbol of each of W1, W2, W3, W4, W5, W6, W7, W8, W9, and L3 has the same relationship as that shown in FIG. 1. Though symbols of W, L, We, Le, L1 and L2 are not shown in FIG. 5, they have also the same relationship as that shown in FIG. 1. In addition to this, a groove 51 is formed in a first main surface of a first vibrational portion of the first tuning fork arm 50 and a groove 61 is formed in a first main surface of a first vibrational portion of the second tuning fork arm 60.

Similar to this, though it is not viable in FIG. 5, a groove 52 is formed in a second main surface opposite the first main surface of the first vibrational portion of the first tuning fork arm 50 and a groove 62 is formed in a second main surface opposite the first main surface of the first vibrational portion of the second tuning fork arm 60, and there is a relationship of Le≤L2, L10≤L1, where Le represents a length of each of second vibrational portions of the arms 50, 60, and is less than a length L of the first vibrational portion, L2 represents a length of the base portion 55, L10 represents the length of the frame portion 53, and L1 represents a length of the connecting portion 54.

In addition to this, there is a relationship of L2=L10 or L2≠L10, namely, L2>L10 or L2<L10. The relationship is decided by taking into account shock-proof properties and a leakage which is caused by vibration. To get a tuning fork resonator with high shock-proof properties, there is a relationship of L2<L10, and also to get a tuning fork resonator with a decreased leakage, there is a relationship of L2≥L10.

In addition, it is needless to say that all relationships described above are applicable to a unit with a case, a tuning fork resonator housed in the case, and a lid connected to an open end of the case.

Figure 6:
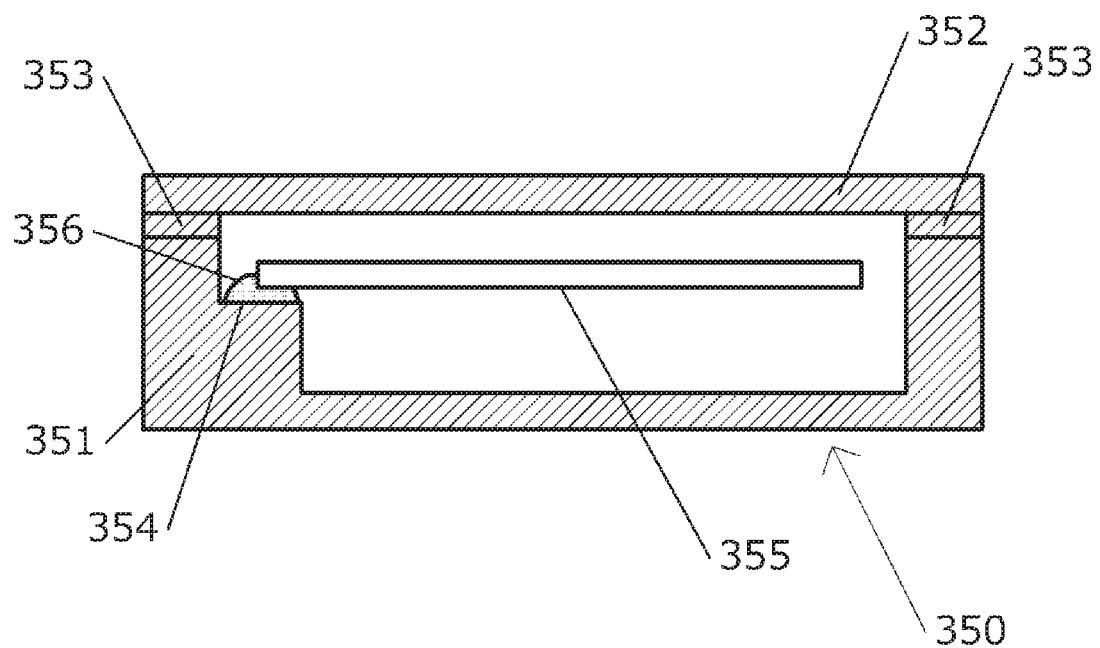
FIG. 6 shows a cross-sectional view of a unit in a third embodiment of the present invention.

FIG. 6 shows a cross-sectional view of a unit 350 in a third embodiment of the present invention. The unit 350 comprises a case 351, a resonator 355, e.g. a tuning fork resonator and a lid 352. Namely, the resonator 355 is mounted on a mounting portion 354 of the case 351 by an adhesive 356, and the lid 352 is connected to an open end of the case 351 through a connecting material 353 in a vacuum.

As shown in FIG. 6, the resonator is actually mounted on the adhesive 356 disposed on the mounting portion 354.

As will be described in FIG. 9 in detail, for first example, the resonator comprises a base portion having a first base portion including first width W14 and a first length L14, and a second base portion including a second width W15 and a second length L5, and a plurality of vibrational arms 1, 2 connected to the first base portion of the base portion, and the second base portion of the base portion is mounted on a mounting portion of a case through an adhesive.

In order to get a resonator with no vibration leakage which is caused by vibration and a stable frequency of oscillation, W14 is within a range of 0.15 mm to 0.268 mm, preferably, within a range of 0.195 mm to 0.255 mm and L14 is within a range of 0.105 mm to 0.16 mm, preferably, within a range of 0.125 mm to 0.158 mm, and also W15 is within a range of 0.3 mm to 0.4 mm. In addition to this, a ratio of W14/W15 is within a range of 0.375 to 0.893, preferably, within a range of 0.48 to 0.71, more preferably, within a range of 0.52 to 0.68 and a ratio of W14/L14 is within a range of 0.94 to 2.55, preferably, within a range of 1.8 to 2.4, more preferably, within a range of 1.9 to 2.2.

For second example, the resonator comprises a base portion having a first base portion and a second base portion, and first and second vibrational arms connected to the first base portion of the base portion, and two frames having a first frame and a second frame are connected to the second base portion of the base portion so that the first and second frames extend in a common direction with the first and second vibrational arms outside the first and second vibrational arms, and so that the second base portion has a concave shape with the first and second frames.

In addition to this, when a length of the second base portion of the base portion is defined by L15, a length of each of the first and second frames is greater than or equal to the length L15 and less than 0.3 mm, and each of the first and second frames is mounted on a mounting portion of a case through an adhesive. Needless to say, a cut or two cuts may be formed between the first and second base portions of the base portion. As is apparent from FIG. 7, the length of the second base portion of the base portion defined by L15 is equivalent to the width F3 shown in FIG. 7.

Figure 7:
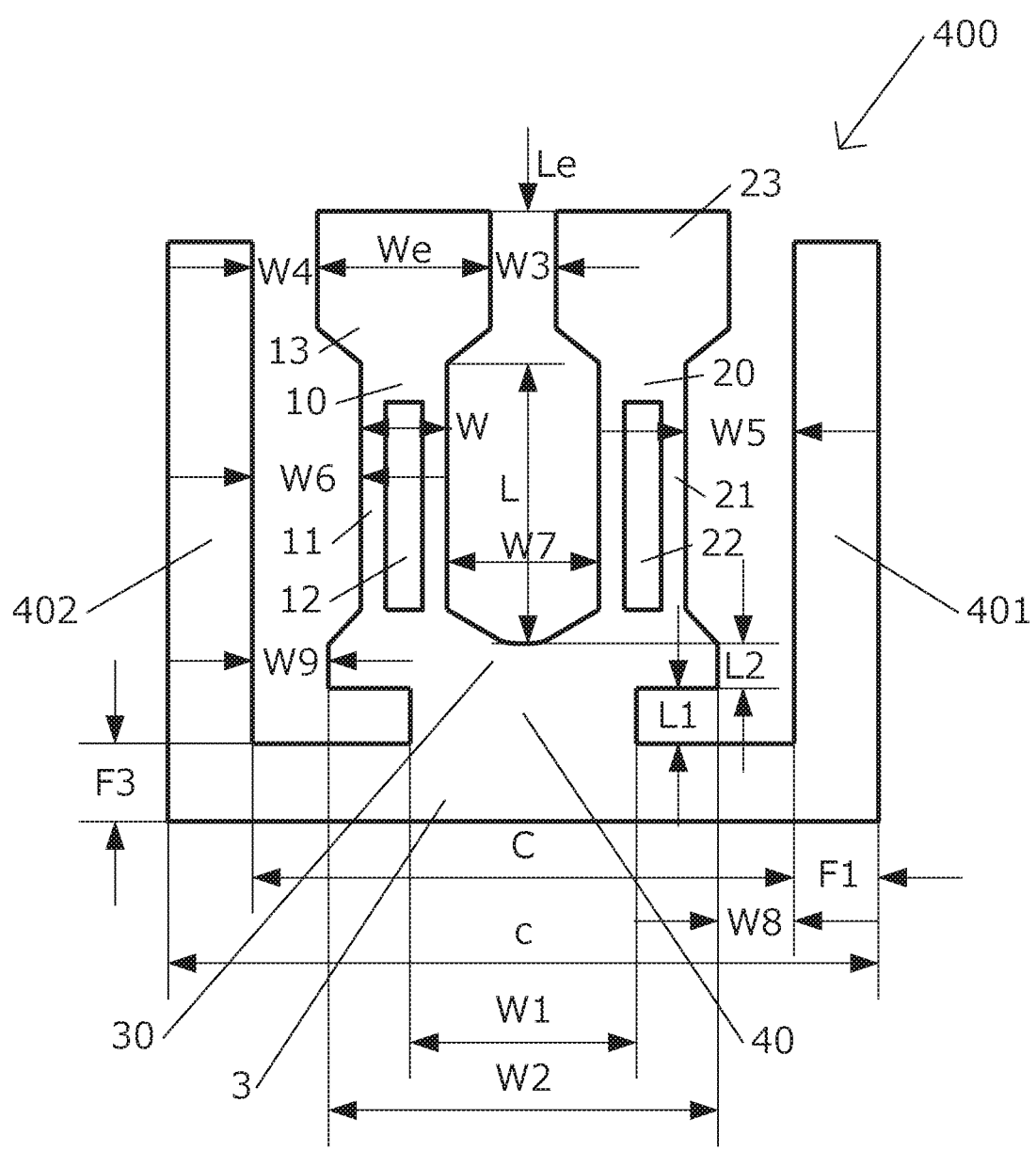
FIG. 7 shows a plan view of a tuning fork resonator in a second embodiment of the present invention.

Though the tuning fork resonator in the first embodiment has the fourth frame portion from the first frame portion, this invention is not limited to this, but may include a tuning fork resonator 400 with no fourth frame portion, as shown in FIG. 7 which shows a plan view of the tuning fork resonator 400 in a second embodiment of the present invention, namely, the tuning fork resonator 400 has only the first, second and third frame portions. Needless to say, in FIG. 7, each symbol has the same relationship as that of FIG. 1.

Figure 8:
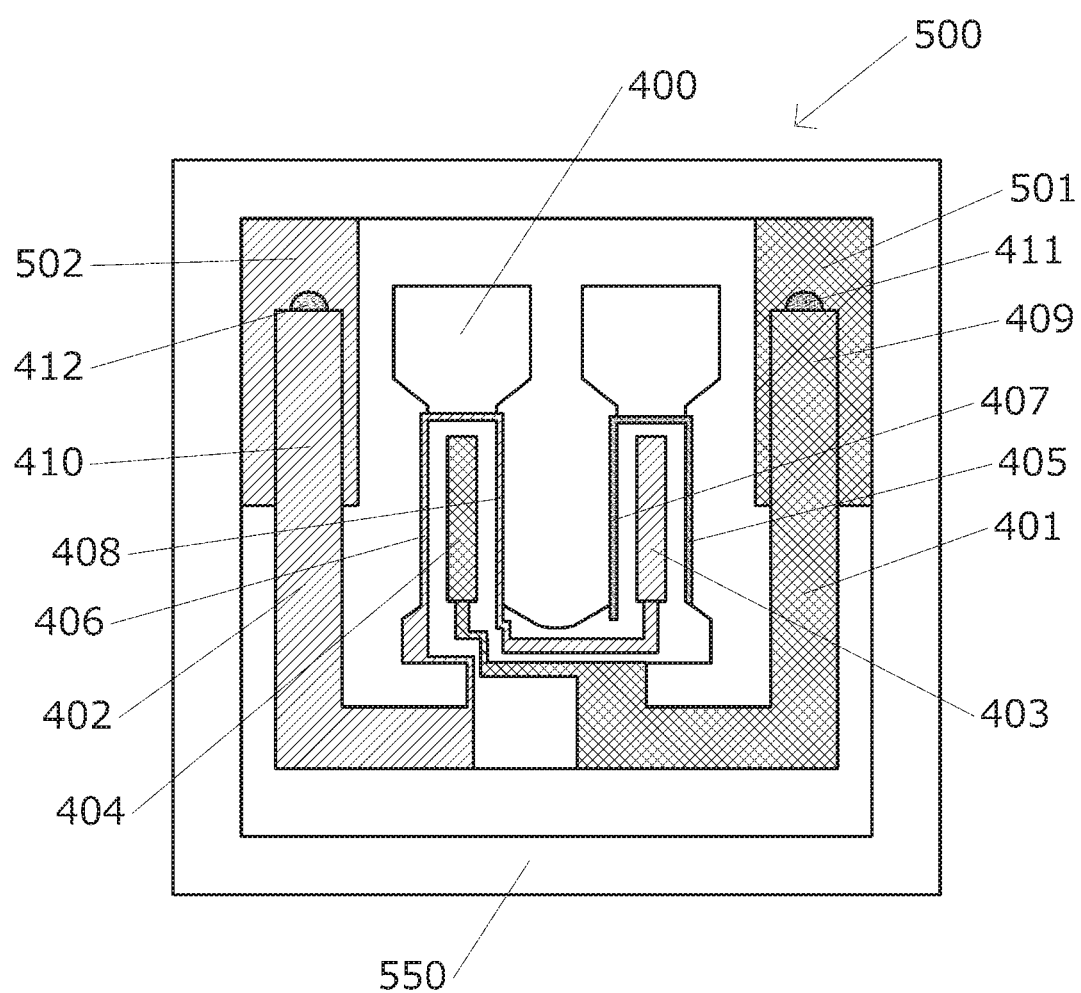
FIG. 8 shows a plan view of a unit in a fourth embodiment of the present invention, and omitting a lid.

For this case, the tuning fork resonator 400 is housed in a case 550, in detail, as shown in FIG. 8 which shows a plan view of a unit 500 in a third embodiment of the present invention, and omitting a lid. The first frame portion 401 is mounted on a first mounting portion 501 of the case 550 by an adhesive 411 and the second frame portion 402 is mounted on a second mounting portion 502 of the case 550 by an adhesive 412, and the lid is connected to the case to cover an open end of the case in a vacuum.

In detail, in FIG. 7 and FIG. 8, the tuning fork arm 10 has an electrode 404 disposed on a surface of the groove 12 and electrodes 406, 408 disposed on side surfaces, and similarly, the tuning fork arm 20 has an electrode 403 disposed on a surface of the groove 22 and electrodes 405, 407 disposed on side surfaces. In addition to this, the first frame portion 401 has an electrode 409 and the second frame portion 402 has an electrode 410.

In more detail, the electrode 410 is connected to the electrodes, 406, 408 and 403 through an electrode disposed on the base portion 30. Similarly, the electrode 409 is connected to the electrode 404 through an electrode disposed on the base portion 30, and the electrodes 405, 407 through an electrode (not viable) disposed on the base portion 30.

In still more detail, the electrode 409 disposed on the first frame portion 401 is connected to an electrode disposed on the first mounting portion 501 of the case 550 and the electrode 410 disposed on the second frame portion 402 is connected to an electrode disposed on the second mounting portion 502 of the case 550.

In this embodiment, though the adhesives 411, 412 are used at end portions of the frame portions 401, 402, this invention is not limited to this, but may include a plurality of adhesives located between the first frame portion 401 and the first mounting portion 501 and a plurality of adhesives located between the second frame portion 402 and the second mounting portion 502.

In addition to this, the arm 10 has a groove (not viable) opposite the groove 12 and the arm 22 has also a groove (not viable) opposite the groove 22, an electrode is disposed on a surface of the groove opposite the groove 12 and a surface of the groove opposite the groove 22 so that the electrode disposed on the surface of the groove opposite the groove 12 has the same electrical polarity as the electrode 404 disposed on the surface of the groove 12 and the electrode disposed on the surface of the groove opposite the groove 22 has the same electrical polarity as the electrode 403 disposed on the surface of the groove 22.

In addition, though the tuning fork resonator in the first embodiment has the fourth frame portion from the first frame portion, this invention is not limited to this, but may include a tuning fork resonator with at least one frame portion, namely, the at least one frame portion is mounted on a mounting portion of a case, and a lid is connected to the case to cover an open end of the case in a vacuum.

For instance, the at least one frame portion (e.g. the third frame portion) may be a base portion of the tuning fork resonator or a frame connected to a base portion of the tuning fork resonator. For this case, at least one portion of the frame is mounted on a mounting portion of the case, preferably, the frame has two portions including first and second portions, and the two portions of the frame are mounted on two mounting portions of the case, e.g. the first portion of the frame is mounted on a first mounting portion of the case and the second portion of the frame is mounted on a second mounting portion of the case, e.g. as shown in FIG. 5.

However, this invention is not limited to this, but may include the frame having equal to or more than two portions each of which is mounted on each mounting portion of the case, e.g. as shown in FIG. 8.

Figure 9:
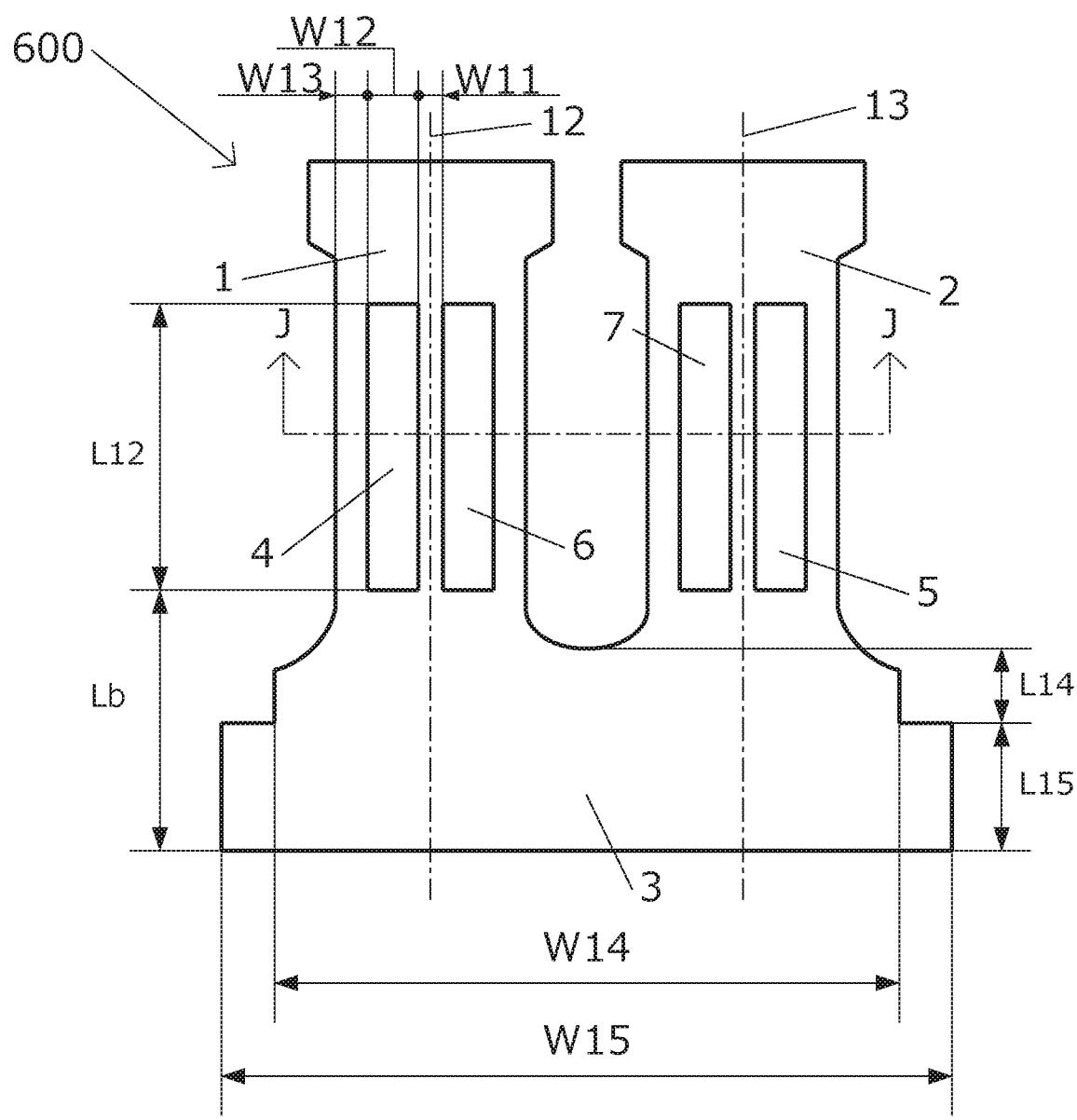
FIG. 9 shows a plan view of a tuning fork resonator in a third embodiment of the present invention.

In the embodiments described above, though the tuning fork resonator comprises two tuning fork arms having first and second tuning fork arms each of which has a groove formed in each of a first main surface and a second main surface opposite the first main surface, this invention is not limited to this, but may include a tuning fork resonator having first and second tuning fork arms each of which has a plurality of grooves including first and second grooves formed in each of a first main surface and a second main surface opposite the first main surface, e.g. as will be shown in FIG. 9.

FIG. 9 shows a plan view of a tuning fork resonator 600 in a third embodiment of the present invention. The resonator 600 comprises vibrational arms 1, 2 and a base portion 3 connected to the vibrational arms 1, 2 and having different widths including a first width W14 and a second width W15 greater than the first width W14. In addition, each of the vibrational arms 1, 2 has a first vibrational portion including a first width W and a first length L, and a second vibrational portion including a second width We greater than the first width W and a second length Le less than the first length L, similar to that shown in FIG. 1.

In FIG. 9, the first vibrational portion of each of the vibrational arms 1, 2 is connected to the base portion 3, and the first vibrational portion has a first main surface and a second main surface opposite the first main surface and side surfaces, and the vibrational arms 1, 2 have central linear portions 12, 13, respectively.

In addition, the vibrational arm 1 has grooves 4, 6 and the vibrational arm 2 has grooves 5, 7, and the grooves 4, 6 are formed between the central linear portion 12 and an outer edge of the vibrational arm 1, respectively. Similar to this, the grooves 5, 7 are formed between the central linear portion 13 and an outer edge of the vibrational arm 2, respectively.

In detail, the grooves 4, 6 are formed in the first main surface of the vibrational arm 1 and the grooves 5, 7 are formed in the first main surface of the vibrational arm 2. Though it is not viable in FIG. 9, a plurality of grooves having first and second grooves is formed in the second main surface opposite the first main surface of each of the vibrational arms 1, 2.

Moreover, each of the grooves 4, 5, 6 and 7 has a width W12, and a width W11 is located at the first main surface of each of the vibrational arms 1, 2 and includes the central linear portions 12, 13. In other words, W11 is a distance in the width direction of the grooves 4, 6 measured from an outer edge of the groove 4 to an outer edge of the groove 6 of the vibrational arm 1, and also a distance in the width direction of the grooves 5, 7 measured from an outer edge of the groove 5 to an outer edge of the groove 7 of the vibrational arm 2.

For the vibrational arm 1, W13 is a distance in the width direction of the groove 4 measured from an outer edge of the groove 4 to an outer edge of the vibrational arm 1 and a distance in the width direction of the groove 6 measured from an outer edge of the groove 6 to an outer edge of the vibrational arm 1.

Similar to this, for the vibrational arm 2, W13 is also a distance in the width direction of the groove 5 measured from an outer edge of the groove 5 to an outer edge of the vibrational arm 2 and a distance in the width direction of the groove 7 measured from an outer edge of the groove 7 to an outer edge of the vibrational arm 2. Therefore, the width W of the first vibrational portion of each of the vibrational arms 1, 2 is defined by W=W11+2W12+2W13, and there is a relationship of W12≥W11, W13 and W13≥W11.

In this embodiment, to get the resonator with a small series resistance R1 and no vibration leakage which is caused by vibration, when a ratio of the second width We and the width W12 is defined by We/W12, the ratio We/W12 is within a range of 1.875 to 15, preferably, within a range of 2.5 to 4.1 or within a range of 5.3 to 13.9, more preferably, within a range of 2.72 to 3.32 or within a range of 5.6 to 10.5.

With respect to a ratio We/W11 of the second width We and the distance W11, the ratio We/W11 is greater than or equal to 40 and less than or equal to 100, preferably, within a range of 60 to 95, as a result of which the resonator having vibrational arms can be obtained with a small series resistance R1 and a small capacitance ratio r because the vibrational arms have a large moment of inertia.

In order to get the resonator with no vibration leakage which is caused by vibration and a stable frequency of oscillation, a ratio We/W7 is greater than or equal to 0.57 and less than or equal to 1.3, preferably, within a range of 0.65 to 0.88 or within a range of 0.92 to 1.08 or within a range of 1.17 to 1.28, where W7 represents a space-apart distance between the first vibrational portions of the vibrational arms 1, 2.

In addition to this, a ratio W13/W12 of the distance W13 and the width W12 is greater than or equal to 0.045 and less than or equal to 0.8, preferably, greater than 0.045 and less than 0.41 or within a range of 0.046 to 0.075 or within a range of 0.12 to 0.4, more preferably, within a range of 0.05 to 0.08 or within a range of 0.21 to 0.4.

Moreover, a ratio W13/W11 is greater than or equal to 0.2 and less than or equal to 3.0, preferably, greater than or equal to 0.25 and less than 2.7, more preferably, within a range of 0.45 to 1.15 or within a range of 1.05 to 2.8. In addition to this, a ratio W12/W11 is within a range of 2 to 22.2, preferably, within a range of 7.25 to 8.5.

Concretely, the width W11 is greater than or equal to 0.001 mm and less than or equal to 0.005 mm, preferably, within a range of 0.0012 mm to 0.0018 mm, and the width W13 is is greater than or equal to 0.001 mm and less than or equal to 0.003 mm, preferably, within a range of 0.001 mm to 0.0025 mm.

In FIG. 9, the base portion 3 has a first base portion including a first width W14 and a first length L14, and a second base portion including a second width W15 greater than the first width W14 and a second length L15 greater than or equal to or less than the first length L14, an overall length of the base portion 3 is defined by La=L14+L15, and the second base portion of the base portion 3 is mounted on a mounting portion of a case through adhesives, while each of the grooves 4, 5, 6 and 7 has a length L12, and the length L12 is greater than or equal to 0.3 mm and less than or equal to 0.55 mm, preferably, within a range of 0.3 mm to 0.45 mm or within a range of 0.31 mm to 0.54 mm, more preferably, within a range of 0.31 mm to 0.52 mm.

With respect to a ratio We/La of the second width We and the overall length La of the base portion, the ratio We/La is within a range of 0.25 to 1.85, preferably, within a range of 0.27 to 0.42 or within a range of 0.6 to 0.98 or within a range of 1.1 to 1.85.

Similar to this, with respect to a ratio L12/La of the length L12 of the groove and the overall length La of the base portion, the ratio L12/La is greater than 1.1 to less than 3.2, preferably within a range of 1.2 to 2.3. As a result of which a resonator having tuning fork arms can be obtained with a stable frequency of oscillation and a small series resistance R1 because the resonator has no vibration leakage which is caused by vibration and a large moment of inertia of the tuning fork arms.

In addition, when a distance in the length direction of the base portion measured from an outer edge of the second base portion of the base portion to an outer edge of the groove is defined by Lb, and a difference of Lb and La is defined by Lba=Lb−La, the Lba is greater than or equal to 0, preferably, within a range of 0.035 mm to 0.38 mm, more preferably, within a range of 0.05 to 0.38 mm, as a result of which a resonator can be obtained with high shock-proof properties.

In particular, to get the resonator with no vibration leakage which is caused by vibration, a ratio L15/L12 is greater than or equal to 0.16 and less than or equal to 0.58, preferably, greater than or equal to 0.26 and less than or equal to 0.4. In addition to this, a ratio L14/L15 is greater than 0.6 and less than 1.78, and La is within a range of 0.25 mm to 0.28 mm.

Especially, to get a resonator with a very large moment of inertia of vibrational arms, a ratio L12/W13 is greater than or equal to 100 and less than or equal to 550, preferably, within a range of 150 to 400, more preferably, within a range of 185 to 350, as a result of which the resonator can be provided with a small series resistance R1.

In addition, the second width We is greater than or equal to the length L15 of the second base portion of the base portion to get the resonator with good aging characteristics, and also when a spaced-apart distance between the second vibrational portions of the vibrational arms 1, 2 is defined by W3, the distance W3 is less than or equal to the length L15 of the second base portion.

Though the resonator in FIG. 9 is described above in detail, however, this invention is not limited to this, but may have at least one cut portion between the first and second base portions of the base portion to get the resonator with no vibration leakage and a very stable frequency of oscillation. For this case, a width of the cut portion is less than W14, W15 and a length of the cut portion is less than L14, L15, and the second base portion of the base portion is mounted on a mounting portion of a case through adhesives, namely, the adhesives are located between the mounting portion of the case and the second base portion of the base portion.

In addition, it is needless to say that a shape and an electrode disposition of the resonator in FIG. 9 are applicable to that of the resonator of the unit in FIG. 8. Namely, two frames having first and second frames are connected to the second base portion of the base portion so that the second base portion has a concave shape with the first and second frames, and the first and second frames are mounted on the corresponding one of first and second mounting portions of a case, respectively.

Though two grooves are described in FIG. 9, this invention is not limited to this, but, needless to say, may be applicable to a groove formed in each of the first and second main surfaces of each of the vibrational arms 1, 2. In addition to this, though the description is fully performed concerning the ratio We/W12 as already described above, this invention is not limited to this, but may have the ratio We/W12 within a range of 2.3 to 4.3, preferably, within a range of 2.62 to 3.6. In particular, this is very available for a groove which is formed in at least one of the first and second main surfaces of each of the vibrational arms 1, 2. Needless to say, the ratio is also applicable to a plurality of grooves formed in at least one of the first and second main surfaces.

By providing the ratios and the concrete values described above, the resonator 600 having the vibrational arms 1, 2 can be obtained with a small series resistance R1, a small motional inductance Lm and a small capacitance ratio r because it has a very large moment of inertia of the vibrational arms. That is, because it has a very large electromechanical transformation efficiency.

In addition to this, the resonator 600 can be, simultaneously, obtained with a very stable frequency of oscillation and good aging characteristics because it has no vibration leakage which is caused by vibration.

Figure 10:
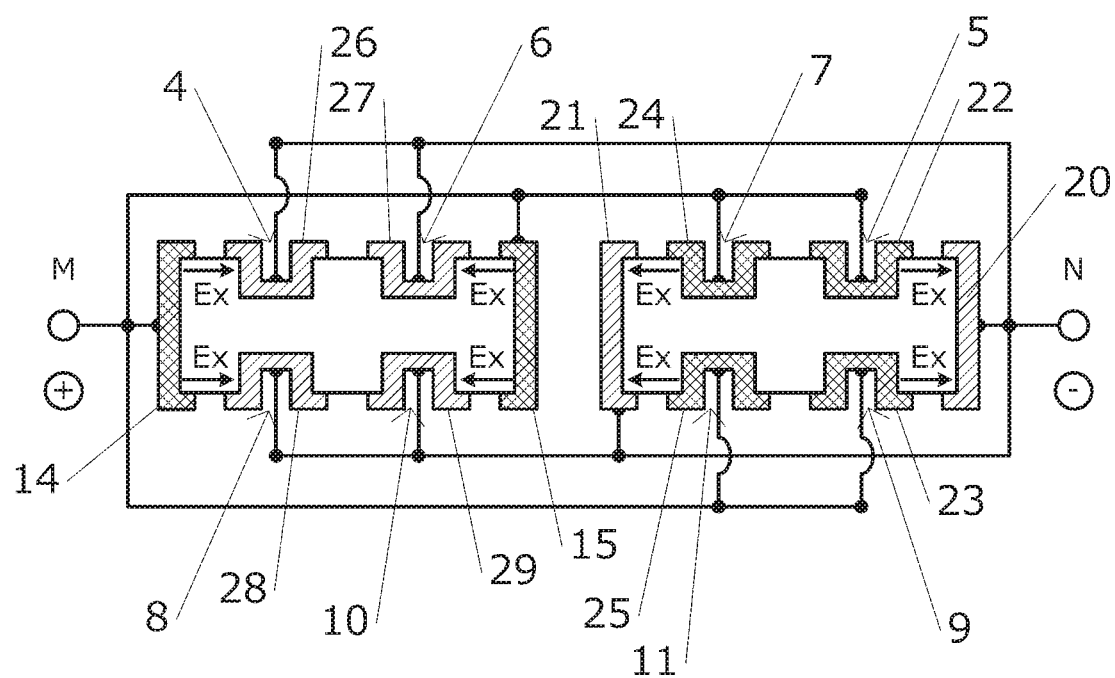
FIG. 10 shows a J-J cross-sectional view of vibrational arms of the tuning fork resonator in FIG. 9.

FIG. 10 shows a J-J cross-sectional view of the vibrational arms of the tuning fork resonator in FIG. 9. In FIG. 10, grooves 4, 6 and grooves 8, 10 are formed at the vibrational arm 1 so that the grooves 4, 6 are formed in the first main surface thereof and the grooves 8, 10 are formed in the second main surface thereof, and the grooves 4, 6, 8 and 10 have a first set of electrodes 26, 27, 28 and 29 of the same electrical polarity, while the side surfaces of the vibrational arm 1 have a second set of electrodes 14, 15 having an opposite electrical polarity to the first set of electrodes 26, 27, 28 and 29.

Similar to this, grooves 5, 7 and grooves 9, 11 are formed at the vibrational arm 2 so that the grooves 5, 7 are formed in the first main surface thereof and the grooves 9, 11 are formed in the second main surface thereof, and the grooves 5, 7, 9 and 11 have a third set of electrodes 22, 23, 24 and 25 of the same electrical polarity, while the side surfaces of the vibrational arm 2 have a fourth set of electrodes 20, 21 having an opposite electrical polarity to the third set of electrodes 22, 23, 24 and 25.

In addition, the electrodes disposed on the vibrational arms 1, 2 are connected as shown in FIG. 10, namely, two electrode terminals of different electrical polarity M-N are obtained.

In detail, the first set of electrodes 26, 27, 28 and 29 disposed on the grooves 4, 6, 8 and 10 of the vibrational arm 1 have the same electrical polarity as the fourth set of electrodes 20, 21 disposed on both side surfaces of the vibrational arm 2, while the second set of electrodes 14, 15 disposed on both side surfaces of the vibrational arm 1 have the same electrical polarity as the third set of electrodes 22, 23, 24 and 25 disposed on the grooves 5, 7, 9 and 11 of the vibrational arm 2.

When a direct current voltage is applied between the electrode terminals M-N, an electric field Ex occurs along the arrow direction inside the vibrational arms 1, 2. As the electric field Ex occurs perpendicular to the electrodes disposed on the vibrational arms, as shown in the arrow signs, the electric field Ex has a very large value and a large distortion occurs at the vibrational arms. As a result of which a tuning fork resonator capable of vibrating in a flexural mode is obtained with a small series resistance R1 and a high quality factor Q because even when miniaturized there is a very large electromechanical transformation efficiency for the resonator.

In addition to this, e.g. when the tuning fork resonator is made of quartz crystal, it is needless to say that each of the grooves of the cross-sectional view of the vibrational arms shown in FIG. 10 has a complicated shape because quartz crystal is an anisotropic material which has an etching speed different in a direction of each of x, y and z axes of the quartz crystal, where x, y and z axes are called electrical axis, mechanical axis and optical axis, respectively.

As shown in FIG. 7 and FIG. 8, two frames are connected to the base portion so that the two frames extend in a common direction with the tuning fork arms outside the tuning fork arms. However, this invention is not limited to this, but may have a frame between the tuning fork arms. For this case, the frame is mounted on a mounting portion of a case so that each of two electrodes is disposed on a surface of the frame to form a first electrode terminal and a second electrode terminal having an electric polarity opposite to an electric polarity of the first electrode terminal.

In addition, though an object of the present invention is to provide a miniature unit with a length of the maximum side less than or equal to 1.35 mm, however, this invention is not limited to this, but may have a unit having a length of the maximum side greater than 1.35 mm. Namely, it is needless to say that this concept is available for the unit having the length greater than 1.35 mm.

In addition to this, e.g., in FIG. 19, when the first vibrational portion of each of the vibrational arms 1, 2 has the width W within a range of 0.035 mm to 0.55 mm, to get a miniature unit having a resonator with a very large moment of inertia of the vibrational arms so that the resonator has a small series resistance R1 and a small motional inductance Lm, a relationship of W13 less than W11 is preferable, namely, W13<W11.

It is described above that the tuning fork resonator in each of the first, second and third embodiments of the present invention is applicable to various examples, it is, therefore, needless to say that the various examples have also the same remarkable effect as that already above-described.

Figure 11:
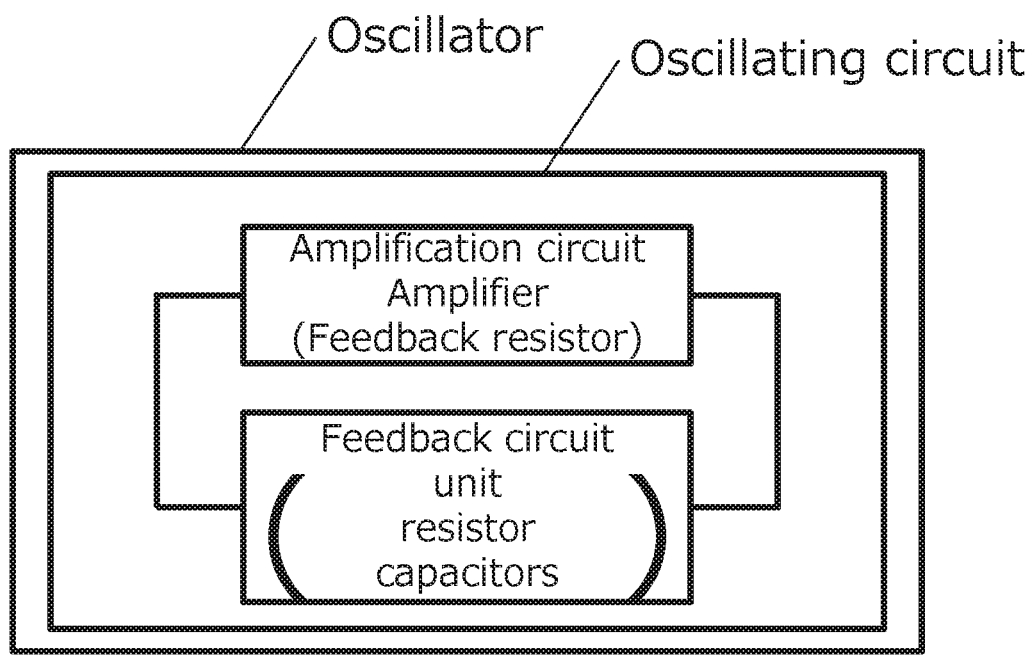
FIG. 11 shows a block diagram of an oscillator in an embodiment of the present invention.

However, each of the units in the embodiments of the present invention is actually used as an oscillator. Namely, as shown in FIG. 11 shows a block diagram of an oscillator in an embodiment of the present invention, the oscillator comprises an oscillating circuit which comprises an amplification circuit having an amplifier and a feedback resistor and a feedback circuit having unit including a resonator or a tuning fork resonator, a resistor and a plurality of capacitors.

Like this, the oscillating circuit comprises the amplification circuit and the feedback circuit, and an output signal of the oscillator comprising the unit of the present invention is used as a clock signal for use in operation of an electronic apparatus such as a wearable phone, a facsimile and so on to display time information at a display portion of the electronic apparatus.

Figure 12:
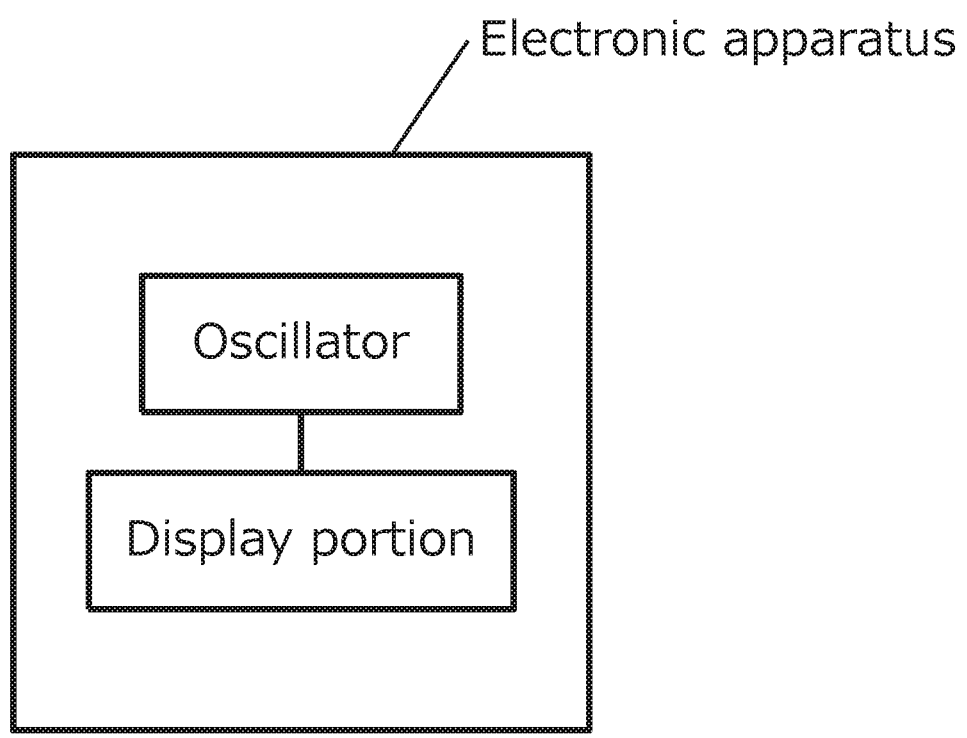
FIG. 12 shows a block diagram of an electronic apparatus in an embodiment of the present invention.

An example is, therefore, shown in FIG. 12 showing a block diagram of an electronic apparatus in an embodiment of the present invention, and the electronic apparatus comprises an oscillator and a display portion. In detail, an output signal of the oscillator comprising a unit of the present invention is used as a clock signal for use in operation of the electronic apparatus to display time information at the display portion of the electronic apparatus.

In addition, as described above, it will be easily understood that the resonator comprising tuning fork arms (vibrational arms) and a base portion, according to the present invention, may have outstanding effects. Similar to this, the unit and the oscillator, according to the present invention, may have also outstanding effects. Moreover, the electronic apparatus comprising the oscillator comprising the oscillating circuit having the tuning fork resonator with novel shapes and excellent electrical characteristics, according to the present invention, may have the outstanding effects. In addition to this, while the present invention has been shown and described with reference to preferred embodiments thereof, it will be understood by those skilled in the art that the changes in shape can be made therein without departing from the spirit and scope of the present invention.

What is claimed is:

1. A quartz crystal unit comprising: a case having a mounting portion, and first, second, third and fourth case portions; a lid; and a resonator having a base portion, and first and second vibrational arms connected to the base portion, the base portion having a first base portion, a second base portion and a cut portion formed between the first and second base portions, the first case portion being connected to the second case portion through each of the third and fourth case portions, each of the first and second case portions extending in a common direction with the first and second vibrational arms outside the first and second vibrational arms, the first case portion adjoining the first vibrational arm, the second case portion adjoining the second vibrational arm, each of the first and second vibrational arms having a first vibrational portion including a first width and a first length, and a second vibrational portion including a second width greater than the first width and a second length less than the first length, the first vibrational portion of each of the first and second vibrational arms being directly connected to the first base portion of the base portion and having a first main surface and a second main surface opposite the first main surface;

wherein the second base portion of the base portion is mounted on the mounting portion of the case;

wherein the lid is connected to the case to cover an open end of the case;

wherein at least one groove is formed in at least one of the first and second main surfaces of the first vibrational portion of each of the first and second vibrational arms;

wherein a spaced-apart distance between the first case portion and the first vibrational portion of the first vibrational arm is defined by a first distance and a spaced-apart distance between the second case portion and the first vibrational portion of the second vibrational arm is defined by a second distance; and wherein the second width of the second vibrational portion of each of the first and second vibrational arms is greater than each of the first distance and the second distance.

2. A quartz crystal unit according to claim 1, wherein the fourth case portion has a width and adjoins the second vibrational portion of each of the first and second vibrational arms; wherein a spaced-apart distance between the fourth case portion and the second vibrational portion of each of the first and second vibrational arms is defined by a third distance; wherein a spaced-apart distance between the first case portion and the second vibrational portion of the first vibrational arm is defined by a fourth distance; and wherein the width of the fourth case portion is greater than each of the third distance and the fourth distance.

3. A quartz crystal unit according to claim 2, wherein the base portion has two cut portions formed between the first and second base portions and a third base portion connecting the first base portion to the second base portion and including a third length; wherein a spaced-apart distance between the second vibrational portion of the first vibrational arm and the second vibrational portion of the second vibrational arm is defined by a fifth distance; and wherein the width of the fourth case portion is greater than each of the third length of the third base portion and the fifth distance.

4. A quartz crystal unit according to claim 2, wherein the base portion has two cut portions formed between the first and second base portions; wherein the resonator has only the base portion, and the first and second vibrational arms connected to the base portion; wherein a spaced-apart distance between the second case portion and the second vibrational portion of the second vibrational arm is defined by a fourth distance; wherein the width of the fourth case portion is greater than the fourth distance; wherein the at least one groove comprises a groove formed in at least one of the first and second main surfaces of the first vibrational portion of each of the first and second vibrational arms so that a width of the groove formed in the at least one of the first and second main surfaces of the first vibrational portion of each of the first and second vibrational arms is greater than a distance in the width direction of the groove measured from an outer edge of the groove to an outer edge of the corresponding one of the first and second vibrational arms;

wherein the first width of the first vibrational portion of each of the first and second vibrational arms is defined by W and the first length of the first vibrational portion of each of the first and second vibrational arms is defined by L; wherein a ratio of the first width W of the first vibrational portion of each of the first and second vibrational arms and the first length L of the first vibrational portion of the corresponding one of the first and second vibrational arms is defined by a first ratio W/L; wherein the first ratio W/L is greater than 0.098; wherein a spaced-apart distance between the first vibrational portion of the first vibrational arm and the first vibrational portion of the second vibrational arm is defined by a fifth distance; and wherein the fifth distance is less than or equal to at least one of the first distance and the second distance.

5. A quartz crystal unit comprising: a case having first, second, third and fourth case portions; a lid; and a resonator having a base portion, and first and second vibrational arms connected to the base portion, the base portion having a plurality of base portions including a first base portion having a first width and a second base portion having a second width different from the first width, the first case portion being connected to the second case portion through each of the third and fourth case portions, each of the first and second case portions extending in a common direction with the first and second vibrational arms outside the first and second vibrational arms, each of the first and second vibrational arms having a first vibrational portion including a first width and a first length, and a second vibrational portion including a second width greater than the first width and a second length less than the first length, the first vibrational portion of each of the first and second vibrational arms being directly connected to the first base portion of the base portion and having a first main surface and a second main surface opposite the first main surface;
  wherein at least one groove is formed in at least one of the first and second main surfaces of the first vibrational portion of each of the first and second vibrational arms;
  wherein the first case portion adjoins the first vibrational arm, the second case portion adjoins the second vibrational arm and the fourth case portion adjoins the second vibrational portion of each of the first and second vibrational arms, each of the first and second case portions having a width, the first base portion of the base portion having a first length and a spaced-apart distance between the fourth case portion and the second vibrational portion of each of the first and second vibrational arms being defined by a first distance; and
  wherein the width of each of the first and second case portions is greater than each of the first distance and the first length of the first base portion of the base portion.

6. A quartz crystal unit according to claim 5, wherein the base portion has a cut portion formed between the first and second base portions and a third base portion connecting the first base portion to the second base portion and including a third width less than each of the first width of the first base portion and the second width of the second base portion; wherein the first width of the first base portion is less than the second width of the second base portion; wherein the case has a mounting portion; wherein the second base portion of the base portion is mounted on the mounting portion of the case; wherein the lid is connected to the case to cover an open end of the case; wherein a spaced-apart distance between the first vibrational portion of the first vibrational arm and the first vibrational portion of the second vibrational arm is defined by a second distance; and wherein the second width of the second vibrational portion of each of the first and second vibrational arms is less than the second distance.

7. A quartz crystal unit according to claim 6, wherein a spaced-apart distance between the first case portion and the second vibrational portion of the first vibrational arm is defined by a third distance and a spaced-apart distance between the second case portion and the second vibrational portion of the second vibrational arm is defined by a fourth distance; and wherein the width of each of the first and second case portions is greater than at least one of the third distance and the fourth distance.

8. A quartz crystal unit according to claim 6, wherein each of the first, second, third and fourth case portions of the case has an outer side surface and an inner side surface; wherein a length of the outer side surface of each of the first, second, third and fourth case portions is, respectively, defined by a, b, c and d; wherein a first length dimension Lo is defined by Lo=a+b+c+d; wherein a length of the inner side surface of each of the first, second, third and fourth case portions is, respectively, defined by A, B, C and D; wherein a second length dimension Li is defined by Li=A+B+C+D; wherein the first length dimension Lo is within a range of 2.4 mm to 5 mm; and wherein the second length dimension Li is within a range of 1.6 mm to 4.2 mm.

9. A quartz crystal unit according to claim 6, wherein the fourth case portion has a width; wherein the width of the fourth case portion is greater than the first distance; wherein a spaced-apart distance between the second vibrational portion of the first vibrational arm and the second vibrational portion of the second vibrational arm is defined by a third distance; and wherein the width of each of the first and second case portions is greater than the third distance.

10. A quartz crystal unit according to claim 6, wherein the second base portion of the base portion has a second length; wherein the second length of the second base portion is less than the first length of the first base portion; wherein the fourth case portion has a width; and wherein the width of each of the first and second case portions is greater than the width of the fourth case portion.

11. A quartz crystal unit according to claim 5, wherein the base portion has a cut portion formed between the first and second base portions; wherein a spaced-apart distance between the first vibrational portion of the first vibrational arm and the first vibrational portion of the second vibrational arm is defined by a second distance; wherein the second width of the second vibrational portion of each of the first and second vibrational arms is greater than the second distance; wherein the fourth case portion has a width; wherein the width of the fourth case portion is greater than the first distance; wherein a spaced-apart distance between the first case portion and the second vibrational portion of the first vibrational arm is defined by a third distance; wherein a spaced-apart distance between the second vibrational portion of the first vibrational arm and the second vibrational portion of the second vibrational arm is defined by a fourth distance; and wherein the third distance is greater than the fourth distance.

12. A quartz crystal unit according to claim 11, wherein the at least one groove comprises a groove formed in at least one of the first and second main surfaces of the first vibrational portion of each of the first and second vibrational arms so that a width of the groove formed in the at least one of the first and second main surfaces of the first vibrational portion of each of the first and second vibrational arms is greater than a distance in the width direction of the groove measured from an outer edge of the groove to an outer edge of the corresponding one of the first and second vibrational arms; wherein two frame portions having first and second frame portions protrude from the base portion so that each of the first and second frame portions extends in a common direction with the first and second vibrational arms outside the first and second vibrational arms; wherein the case has first and second mounting portions; wherein the first frame portion is mounted on the first mounting portion of the case and the second frame portion is mounted on the second mounting portion of the case; wherein the first frame portion adjoins the first vibrational arm and the second frame portion adjoins the second vibrational arm; wherein the first vibrational portion of each of the first and second vibrational arms has a first side surface and a second side surface opposite the first side surface; wherein a first electrode is disposed on a surface of the groove formed in the at least one of the first and second main surfaces of the first vibrational portion of each of the first and second vibrational arms; wherein a second electrode is disposed on each of the first and second side surfaces of the first vibrational portion of each of the first and second vibrational arms; wherein a third electrode is disposed on a surface of each of the first and second frame portions; wherein a fourth electrode is disposed on a surface of each of the first and second mounting portions; wherein the first electrode disposed on the surface of the groove formed in the at least one of the first and second main surfaces of the first vibrational portion of the first vibrational arm is connected to each of the second electrode disposed on each of the first and second side surfaces of the first vibrational portion of the second vibrational arm through an electrode disposed on the base portion and the third electrode disposed on the surface of the second frame portion, and the third electrode disposed on the surface of the second frame portion is connected to the fourth electrode disposed on the surface of the second mounting portion of the case; wherein the first electrode disposed on the surface of the groove formed in the at least one of the first and second main surfaces of the first vibrational portion of the second vibrational arm is connected to each of the second electrode disposed on each of the first and second side surfaces of the first vibrational portion of the first vibrational arm and the third electrode disposed on the surface of the first frame portion through an electrode disposed on the base portion, and the third electrode disposed on the surface of the first frame portion is connected to the fourth electrode disposed on the surface of the first mounting portion of the case; wherein the first electrode of the first vibrational arm has an electrical polarity opposite to an electrical polarity of the third electrode of the first frame portion; and wherein the first electrode of the second vibrational arm has an electrical polarity opposite to an electrical polarity of the third electrode of the second frame portion.

13. A quartz crystal unit according to claim 12, wherein the width of the fourth case portion is greater than the second distance; wherein each of the first, second, third and fourth case portions of the case has an outer side surface and an inner side surface; wherein a length of the outer side surface of each of the first, second, third and fourth case portions is, respectively, defined by a, b, c and d; wherein a first length dimension Lo is defined by Lo=a+b+c+d; wherein a length of the inner side surface of each of the first, second, third and fourth case portions is, respectively, defined by A, B, C and D; wherein a second length dimension Li is defined by Li=A+B+C+D; wherein the first length dimension Lo is within a range of 2.4 mm to 5 mm; and wherein the second length dimension Li is within a range of 1.6 mm to 4.2 mm.

14. A quartz crystal unit according to claim 5, wherein the first width of the first base portion is less than the second width of the second base portion; wherein the at least one groove comprises a groove formed in at least one of the first and second main surfaces of the first vibrational portion of each of the first and second vibrational arms so that a width of the groove formed in the at least one of the first and second main surfaces of the first vibrational portion of each of the first and second vibrational arms is greater than a distance in the width direction of the groove measured from an outer edge of the groove to an outer edge of the corresponding one of the first and second vibrational arms; wherein a first frame portion is directly connected to the second base portion of the base portion and a second frame portion is directly connected to the second base portion of the base portion so that each of the first and second frame portions extends in a common direction with the first and second vibrational arms outside the first and second vibrational arms; wherein the case has first and second mounting portions; wherein the first frame portion is mounted on the first mounting portion of the case and the second frame portion is mounted on the second mounting portion of the case; wherein the lid is connected to the case to cover an open end of the case; wherein the first frame portion adjoins the first vibrational arm and the second frame portion adjoins the second vibrational arm; wherein a spaced-apart distance between the first frame portion and the first vibrational portion of the first vibrational arm is defined by a second distance and a spaced-apart distance between the second frame portion and the first vibrational portion of the second vibrational arm is defined by a third distance; wherein the second width of the second vibrational portion of each of the first and second vibrational arms is greater than each of the second distance and the third distance; wherein an electrode is disposed on each of a surface of the groove formed in the at least one of the first and second main surfaces of the first vibrational portion of each of the first and second vibrational arms, a surface of each of the first and second frame portions and a surface of each of the first and second mounting portions; wherein the electrode disposed on the surface of the groove formed in the at least one of the first and second main surfaces of the first vibrational portion of the first vibrational arm is connected to each of the electrode disposed on the surface of the second frame portion and the electrode disposed on the surface of the second mounting portion of the case so that the electrode of the first vibrational arm has the same electrical polarity as the electrode of each of the second frame portion and the second mounting portion of the case; wherein the electrode disposed on the surface of the groove formed in the at least one of the first and second main surfaces of the first vibrational portion of the second vibrational arm is connected to each of the electrode disposed on the surface of the first frame portion and the electrode disposed on the surface of the first mounting portion of the case so that the electrode of the second vibrational arm has the same electrical polarity as the electrode of each of the first frame portion and the first mounting portion of the case; wherein the electrode of the first vibrational arm has an electrical polarity opposite to an electrical polarity of the electrode of each of the first frame portion and the first mounting portion of the case; and wherein the electrode of the second vibrational arm has an electrical polarity opposite to an electrical polarity of the electrode of each of the second frame portion and the second mounting portion of the case.

15. A quartz crystal unit according to claim 14, wherein the base portion has a third base portion connecting the first base portion to the second base portion and including a third width less than each of the first width of the first base portion and the second width of the second base portion, two cut portions being formed between the first and second base portions; wherein the first frame portion is directly connected to the second base portion of the base portion and the second frame portion is directly connected to the second base portion of the base portion so that the second base portion has a concave shape with the first and second frame portions; wherein a spaced-apart distance between the first vibrational portion of the first vibrational arm and the first vibrational portion of the second vibrational arm is defined by a fourth distance; wherein the second width of the second vibrational portion of each of the first and second vibrational arms is greater than the fourth distance; wherein the fourth case portion has a width; wherein a spaced-apart distance between the second vibrational portion of the first vibrational arm and the second vibrational portion of the second vibrational arm is defined by a fifth distance; and wherein the width of the fourth case portion is greater than each of the first distance and the fifth distance.

16. A quartz crystal unit according to claim 14, wherein the base portion has two cut portions formed between the first and second base portions; wherein the first frame portion is directly connected to the second base portion of the base portion and the second frame portion is directly connected to the second base portion of the base portion so that the second base portion has a concave shape with the first and second frame portions; wherein a spaced-apart distance between the first vibrational portion of the first vibrational arm and the first vibrational portion of the second vibrational arm is defined by a fourth distance; wherein the second width of the second vibrational portion of each of the first and second vibrational arms is greater than the fourth distance; wherein the second base portion of the base portion has a second length; and wherein the width of each of the first and second case portions is greater than the second length of the second base portion of the base portion.

17. A quartz crystal unit according to claim 14, wherein the at least one groove comprises a groove formed in at least one of the first and second main surfaces of the first vibrational portion of each of the first and second vibrational arms so that a length of the groove formed in the at least one of the first and second main surfaces of the first vibrational portion of each of the first and second vibrational arms is greater than or equal to 0.3 mm and less than or equal to 0.55 mm; wherein each of the first, second, third and fourth case portions of the case has an outer side surface and an inner side surface; wherein a length of the outer side surface of each of the first, second, third and fourth case portions is, respectively, defined by a, b, c and d; wherein a first length dimension Lo is defined by Lo=a+b+c+d; wherein a length of the inner side surface of each of the first, second, third and fourth case portions is, respectively, defined by A, B, C and D; wherein a second length dimension Li is defined by Li=A+B+C+D; wherein a dimension difference Loi is defined by Loi=Lo−Li; wherein the first length dimension Lo is within a range of 2.4 mm to 5 mm; wherein the second length dimension Li is within a range of 1.6 mm to 4.2 mm; and wherein the dimension difference Loi is within a range of 0.8 mm to 3.4 mm.

18. A quartz crystal unit according to claim 14, wherein a ratio of the second width of the second vibrational portion of each of the first and second vibrational arms and the first width of the first vibrational portion of the corresponding one of the first and second vibrational arms is defined by a first ratio; wherein the first ratio is within a range of 2.35 to 5.8; wherein the first vibrational portion of each of the first and second vibrational arms has a first side surface and a second side surface opposite the first side surface; wherein an electrode is disposed on each of the first and second side surfaces of the first vibrational portion of each of the first and second vibrational arms; wherein the electrode disposed on each of the first and second side surfaces of the first vibrational portion of the first vibrational arm is connected to the electrode disposed on the surface of the first mounting portion of the case through the electrode disposed on the surface of the first frame portion; and wherein the electrode disposed on each of the first and second side surfaces of the first vibrational portion of the second vibrational arm is connected to the electrode disposed on the surface of the second mounting portion of the case through the electrode disposed on the surface of the second frame portion.

19. A quartz crystal unit according to claim 5, wherein the first width of the first base portion is less than the second width of the second base portion; wherein the at least one groove comprises a groove formed in at least one of the first and second main surfaces of the first vibrational portion of each of the first and second vibrational arms so that a width of the groove formed in the at least one of the first and second main surfaces of the first vibrational portion of each of the first and second vibrational arms is greater than a distance in the width direction of the groove measured from an outer edge of the groove to an outer edge of the corresponding one of the first and second vibrational arms; wherein a first frame portion is directly connected to the second base portion of the base portion and a second frame portion is directly connected to the second base portion of the base portion so that each of the first and second frame portions extends in a common direction with the first and second vibrational arms outside the first and second vibrational arms; wherein the case has first and second mounting portions; wherein the first frame portion is mounted on the first mounting portion of the case and the second frame portion is mounted on the second mounting portion of the case; wherein the lid is connected to the case to cover an open end of the case; wherein the first frame portion adjoins the first vibrational arm and the second frame portion adjoins the second vibrational arm; wherein a spaced-apart distance between the first frame portion and the first vibrational portion of the first vibrational arm is defined by a second distance and a spaced-apart distance between the second frame portion and the first vibrational portion of the second vibrational arm is defined by a third distance; wherein a spaced-apart distance between the first vibrational portion of the first vibrational arm and the first vibrational portion of the second vibrational arm is defined by a fourth distance; wherein the fourth distance is greater than each of the second distance and the third distance; wherein the first vibrational portion of each of the first and second vibrational arms has a first side surface and a second side surface opposite the first side surface; wherein an electrode is disposed on a surface of the groove formed in the at least one of the first and second main surfaces of the first vibrational portion of each of the first and second vibrational arms, each of the first and second side surfaces of the first vibrational portion of each of the first and second vibrational arms, a surface of each of the first and second frame portions and a surface of each of the first and second mounting portions of the case; wherein the electrode disposed on the surface of the groove formed in the at least one of the first and second main surfaces of the first vibrational portion of the first vibrational arm is connected to the electrode disposed on each of the first and second side surfaces of the first vibrational portion of the second vibrational arm through an electrode disposed on a surface of the base portion; wherein the electrode disposed on each of the first and second side surfaces of the first vibrational portion of the second vibrational arm is connected to the electrode disposed on the surface of the second mounting portion of the case through each of an electrode disposed on a surface of the base portion and the electrode disposed on the surface of the second frame portion; and wherein the electrode disposed on the surface of the groove formed in the at least one of the first and second main surfaces of the first vibrational portion of the second vibrational arm is connected to the electrode disposed on the surface of the first mounting portion of the case through each of an electrode disposed on a surface of the base portion and the electrode disposed on the surface of the first frame portion.

20. A quartz crystal unit according to claim 5; wherein the base portion has a cut portion formed between the first and second base portions; wherein the case has a mounting portion; wherein the second base portion of the base portion is mounted on the mounting portion of the case; wherein the lid is connected to the case to cover an open end of the case; wherein the second base portion of the base portion has a second length; wherein the width of each of the first and second case portions is greater than the second length of the second base portion of the base portion; wherein a spaced-apart distance between the first case portion and the first vibrational portion of the first vibrational arm is defined by a second distance and a spaced-apart distance between the second case portion and the first vibrational portion of the second vibrational arm is defined by a third distance; wherein the second width of the second vibrational portion of each of the first and second vibrational arms is less than each of the second distance and the third distance; wherein the at least one groove comprises a groove formed in at least one of the first and second main surfaces of the first vibrational portion of each of the first and second vibrational arms so that a width of the groove formed in the at least one of the first and second main surfaces of the first vibrational portion of each of the first and second vibrational arms is greater than a distance in the width direction of the groove measured from an outer edge of the groove to an outer edge of the corresponding one of the first and second vibrational arms; wherein the first vibrational portion of each of the first and second vibrational arms has a first side surface and a second side surface opposite the first side surface; wherein an electrode is disposed on each of a surface of the groove formed in the at least one of the first and second main surfaces of the first vibrational portion of each of the first and second vibrational arms and at least one of the first and second side surfaces of the first vibrational portion of each of the first and second vibrational arms; wherein the electrode disposed on the surface of the groove formed in the at least one of the first and second main surfaces of the first vibrational portion of the first vibrational arm is connected to the electrode disposed on the at least one of the first and second side surfaces of the first vibrational portion of the second vibrational arm through an electrode disposed on a surface of the base portion; wherein the electrode disposed on the surface of the groove formed in the at least one of the first and second main surfaces of the first vibrational portion of the second vibrational arm is connected to an electrode disposed on a surface of the base portion; wherein a spaced-apart distance between the second vibrational portion of the first vibrational arm and the second vibrational portion of the second vibrational arm is defined by a fourth distance; and wherein the fourth distance is less than the second distance defined by the spaced-apart distance between the first case portion and the first vibrational portion of the first vibrational arm.

21. A quartz crystal oscillator comprising: a quartz crystal oscillating circuit having a quartz crystal unit comprised of a case having first, second, third and fourth case portions, a lid, and a resonator having a base portion, and first and second vibrational arms connected to the base portion, the base portion having a plurality of base portions including a first base portion having a first width and a second base portion having a second width different from the first width, the first case portion being connected to the second case portion through each of the third and fourth case portions, each of the first and second case portions extending in a common direction with the first and second vibrational arms outside the first and second vibrational arms, each of the first and second vibrational arms having a first vibrational portion including a first width and a first length, and a second vibrational portion including a second width greater than the first width and a second length less than the first length, the first vibrational portion of each of the first and second vibrational arms being directly connected to the first base portion of the base portion and having a first main surface and a second main surface opposite the first main surface;
wherein at least one groove is formed in at least one of the first and second main surfaces of the first vibrational portion of each of the first and second vibrational arms;
wherein the first case portion adjoins the first vibrational arm and the second case portion adjoins the second vibrational arm, each of the first and second case portions having a width and each of the first and second base portions of the base portion having a length; and
wherein the width of each of the first and second case portions is greater than the length of each of the first and second base portions of the base portion.

22. A quartz crystal oscillator according to claim 21, wherein the fourth case portion adjoins the second vibrational portion of each of the first and second vibrational arms; wherein a spaced-apart distance between the fourth case portion and the second vibrational portion of each of the first and second vibrational arms is defined by a first distance; and wherein the width of each of the first and second case portions is greater than the first distance.

23. A quartz crystal oscillator according to claim 21, wherein the case has a mounting portion; wherein the base portion has a cut portion formed between the first and second base portions; wherein the second base portion of the base portion is mounted on the mounting portion of the case; wherein the lid is connected to the case to cover an open end of the case; wherein a spaced-apart distance between the first case portion and the first vibrational portion of the first vibrational arm is defined by a first distance and a spaced-apart distance between the second case portion and the first vibrational portion of the second vibrational arm is defined by a second distance; and wherein the second width of the second vibrational portion of each of the first and second vibrational arms is greater than each of the first distance and the second distance.

24. A quartz crystal oscillator according to claim 21, wherein the base portion has a cut portion formed between the first and second base portions; wherein the case has a mounting portion; wherein the second base portion of the base portion is mounted on the mounting portion of the case; wherein the lid is connected to the case to cover an open end of the case; wherein a spaced-apart distance between the first vibrational portion of the first vibrational arm and the first vibrational portion of the second vibrational arm is defined by a first distance; and wherein the second width of the second vibrational portion of each of the first and second vibrational arms is less than the first distance.

25. A quartz crystal oscillator according to claim 21, wherein the first width of the first base portion is less than the second width of the second base portion; wherein the at least one groove comprises a groove formed in at least one of the first and second main surfaces of the first vibrational portion of each of the first and second vibrational arms so that a width of the groove formed in the at least one of the first and second main surfaces of the first vibrational portion of each of the first and second vibrational arms is greater than a distance in the width direction of the groove measured from an outer edge of the groove to an outer edge of the corresponding one of the first and second vibrational arms; wherein a first frame portion is directly connected to the second base portion of the base portion and a second frame portion is directly connected to the second base portion of the base portion so that each of the first and second frame portions extends in a common direction with the first and second vibrational arms outside the first and second vibrational arms; wherein the case has first and second mounting portions; wherein the first frame portion is mounted on the first mounting portion of the case and the second frame portion is mounted on the second mounting portion of the case; wherein the lid is connected to the case to cover an open end of the case; wherein the first frame portion adjoins the first vibrational arm and the second frame portion adjoins the second vibrational arm; wherein a spaced-apart distance between the first frame portion and the first vibrational portion of the first vibrational arm is defined by a first distance and a spaced-apart distance between the second frame portion and the first vibrational portion of the second vibrational arm is defined by a second distance; wherein the second width of the second vibrational portion of each of the first and second vibrational arms is greater than each of the first distance and the second distance; wherein a spaced-apart distance between the first vibrational portion of the first vibrational arm and the first vibrational portion of the second vibrational arm is defined by a fourth distance; wherein the fourth distance is greater than each of the first distance and the second distance; wherein an electrode is disposed on each of a surface of the groove formed in the at least one of the first and second main surfaces of the first vibrational portion of each of the first and second vibrational arms and a surface of each of the first and second frame portions; wherein the electrode disposed on the surface of the groove formed in the at least one of the first and second main surfaces of the first vibrational portion of the first vibrational arm is connected to the electrode disposed on the surface of the second frame portion so that the electrode of the first vibrational arm has the same electrical polarity as the electrode of the second frame portion; wherein the electrode disposed on the surface of the groove formed in the at least one of the first and second main surfaces of the first vibrational portion of the second vibrational arm is connected to the electrode disposed on the surface of the first frame portion so that the electrode of the second vibrational arm has the same electrical polarity as the electrode of the first frame portion; wherein the electrode of the first vibrational arm has an electrical polarity opposite to an electrical polarity of the electrode of the first frame portion; and wherein the electrode of the second vibrational arm has an electrical polarity opposite to an electrical polarity of the electrode of the second frame portion.

26. A quartz crystal oscillator according to claim 25, wherein the first vibrational portion of each of the first and second vibrational arms has a first side surface and a second side surface opposite the first side surface; wherein an electrode is disposed on each of the first and second side surfaces of the first vibrational portion of each of the first and second vibrational arms and a surface of each of the first and second mounting portions of the case; wherein the electrode disposed on each of the first and second side surfaces of the first vibrational portion of the first vibrational arm is connected to the electrode disposed on the surface of the first mounting portion of the case through the electrode disposed on the surface of the first frame portion; and wherein the electrode disposed on each of the first and second side surfaces of the first vibrational portion of the second vibrational arm is connected to the electrode disposed on the surface of the second mounting portion of the case through the electrode disposed on the surface of the second frame portion.

\* \* \* \* \*